United States Patent
Faerber et al.

(10) Patent No.: US 9,450,605 B2
(45) Date of Patent: Sep. 20, 2016

(54) BLOCK COMPRESSION OF TABLES WITH REPEATED VALUES

(71) Applicants: Franz Faerber, Walldorf (DE); Guenter Radestock, Karlsruhe (DE); Andrew Ross, Altrip (DE)

(72) Inventors: Franz Faerber, Walldorf (DE); Guenter Radestock, Karlsruhe (DE); Andrew Ross, Altrip (DE)

(73) Assignee: SAP SE, Walldorf (DE)

(*) Notice: Subject to any disclaimer, the term of this patent is extended or adjusted under 35 U.S.C. 154(b) by 6 days.

(21) Appl. No.: 13/674,477

(22) Filed: Nov. 12, 2012

(65) Prior Publication Data
US 2013/0073530 A1 Mar. 21, 2013

Related U.S. Application Data

(63) Continuation of application No. 12/848,862, filed on Aug. 2, 2010, now Pat. No. 8,326,810, which is a continuation of application No. 11/805,186, filed on May 21, 2007, now Pat. No. 7,769,729.

(51) Int. Cl.
G06F 17/30 (2006.01)
H03M 7/30 (2006.01)

(52) U.S. Cl.
CPC ...... H03M 7/3084 (2013.01); G06F 17/30315 (2013.01)

(58) Field of Classification Search
CPC .............................................. G06F 17/30315
See application file for complete search history.

(56) References Cited

U.S. PATENT DOCUMENTS

| | | | |
|---|---|---|---|
| 5,574,906 A | 11/1996 | Morris | |
| 5,870,036 A | 2/1999 | Franaszek et al. | |
| 6,529,912 B2* | 3/2003 | Satoh et al. | 707/693 |
| 2003/0028509 A1* | 2/2003 | Sah | G06F 17/30595 |
| 2004/0034616 A1* | 2/2004 | Witkowski et al. | 707/1 |
| 2004/0225675 A1* | 11/2004 | Benson | 707/102 |
| 2005/0192998 A1* | 9/2005 | Dittrich et al. | 707/102 |

OTHER PUBLICATIONS

Daniel J. Abadi, et al., "Integrating Compression and Execution in Column-Oriented Database Systems", SIGMOD 2006, Jun. 27-29, 2006.

Extended European Search Report (EESR) dated Jun. 8, 2009, issued by the European Patent Office in connection with related European patent application No. 08008447.8-1247.

Salomon, David, "Data Compression: The Complete Reference, 3rd Edition", Springer Verland, New York, USA, 2004 (pp. 168-171).

Franaszk, P., et al., "Parallel compression wth cooperative dictionary construction," Data Compression Conference, 1996 DCC '96. Proceedings Snowbird, UT, USA Mar. 31-Apr. 3, 1996, Los Alamitos, CA, USA, IEEE Comput. Soc., US, Mar. 31, 1996, pp. 200-209.

(Continued)

Primary Examiner — Grace Park
(74) Attorney, Agent, or Firm — Mintz Levin Cohn Ferris Glovsky and Popeo, P.C.

(57) ABSTRACT

Methods and apparatus, including computer program products, for block compression of tables with repeated values. In general, value identifiers representing a compressed column of data may be sorted to render repeated values contiguous, and block dictionaries may be generated. A block dictionary may be generated for each block of value identifiers. Each block dictionary may include a list of block identifiers, where each block identifier is associated with a value identifier and there is a block identifier for each unique value in a block. Blocks may have standard sizes and block dictionaries may be reused for multiple blocks.

20 Claims, 13 Drawing Sheets

(56) References Cited

OTHER PUBLICATIONS

Anonymous: "Offset (computer science", Wikipedia, the free encyclopedia, Mar. 31, 2008, p. 1, http://web.archive.org/web/20080331011547/http://en.wikipedia.org/wiki/Offset_(computer_science).

Summons to attend Oral Proceedings dated Mar. 10, 2016 for EP Application No. 08008447.8.

* cited by examiner

180 → RETURN TOTAL REVENUE FOR IBM SALES

182 → >> RETURN TOTAL REVENUE FOR:
　　　　[ROWS WITH VID = 3 FROM MAIN INDEX]
186 → +/-
184 → [ROWS WITH VID = 4 FROM DELTA INDEX]

FIG. 1C

| | A_1 | A_2 | A_3 | A_4 | A_5 | A_6 | A_7 | A_8 | A_9 |
|---|---|---|---|---|---|---|---|---|---|
| 01 | 0 | 0 | 0 | 0 | 0 | 0 | 0 | 0 | 0 |
| 02 | 0 | 0 | 0 | 0 | 0 | 0 | 0 | 0 | 0 |
| 03 | 0 | 0 | 0 | 0 | 0 | 0 | 0 | 0 | 1 |
| 04 | 0 | 0 | 0 | 0 | 0 | 0 | 0 | 0 | 1 |
| 05 | 0 | 0 | 0 | 0 | 0 | 0 | 0 | 6 | 5 |
| 06 | 0 | 0 | 0 | 0 | 0 | 0 | 4 | 5 | 4 |
| 07 | 0 | 0 | 0 | 0 | 4 | 1 | 5 | 4 | 2 |
| 08 | 0 | 0 | 0 | 3 | 3 | 2 | 3 | 0 | 2 |
| 09 | 0 | 0 | 0 | 4 | 5 | 0 | 0 | 0 | 0 |
| 10 | 0 | 0 | 4 | 2 | 6 | 0 | 2 | 0 | 0 |
| 11 | 0 | 4 | 5 | 2 | 2 | 4 | 1 | 3 | 3 |
| 12 | 0 | 2 | 0 | 2 | 0 | 3 | 2 | 3 | 0 |
| 13 | 0 | 1 | 3 | 0 | 3 | 2 | 0 | 2 | 3 |
| 14 | 0 | 1 | 0 | 0 | 1 | 5 | 5 | 1 | 1 |
| 15 | 0 | 3 | 1 | 1 | 2 | 0 | 0 | 2 | 3 |
| 16 | 0 | 0 | 0 | 2 | 2 | 1 | 5 | 3 | 4 |
| 17 | 1 | 2 | 2 | 2 | 3 | 1 | 0 | 4 | 4 |
| 18 | 0 | 0 | 0 | 0 | 0 | 1 | 0 | 3 | 5 |
| 19 | 0 | 0 | 0 | 0 | 0 | 1 | 4 | 0 | 0 |
| 20 | 1 | 1 | 1 | 1 | 0 | 1 | 0 | 0 | 0 |
| 21 | 2 | 3 | 2 | 2 | 2 | 1 | 0 | 1 | 8 |
| S0 | 19 | 16 | 16 | 13 | 12 | 12 | 12 | 9 | 8 |

FIG. 6

| Block | Row | A1 | A2 | A3 | A4 | A5 |
|---|---|---|---|---|---|---|
| B1 | 1 | 0 | 0 | 0 | 0 | |
| | 2 | 0 | 0 | 0 | 0 | |
| | 3 | 0 | 0 | 0 | 0 | |
| | 4 | 0 | 0 | 0 | 1 | |
| | 5 | 0 | 0 | 0 | 1 | |
| B2 | 6 | 0 | 0 | | | |
| | 7 | 0 | 0 | | | |
| | 8 | 0 | 0 | | | |
| | 9 | 0 | 1 | | | |
| | 10 | 0 | 1 | | | |
| B3 | 11 | 0 | | | | |
| | 12 | 0 | | | | |
| | 13 | 1 | | | | |
| | 14 | 1 | | | | |
| | 15 | 1 | | | | |
| B4 | 16 | 1 | 1 | | | |
| | 17 | 1 | 2 | | | |
| | 18 | 1 | 2 | | | |
| | 19 | 1 | 3 | | | |
| | 20 | 1 | 3 | | | |
| B5 | 21 | 1 | | | | |
| | 22 | 2 | | | | |
| | 23 | 2 | | | | |
| | 24 | 2 | | | | |
| | 25 | 2 | | | | |
| B6 | 26 | 3 | 1 | 0 | | |
| | 27 | 3 | 1 | 0 | | |
| | 28 | 3 | 1 | 0 | | |
| | 29 | 3 | 1 | 1 | | |
| | 30 | 3 | 1 | 1 | | |
| B7 | 31 | 3 | 2 | | | |
| | 32 | 3 | 2 | | | |
| | 33 | 3 | 2 | | | |
| | 34 | 3 | 2 | | | |
| | 35 | 3 | 3 | | | |

FIG. 9

BLOCK COMPRESSION OF TABLES WITH REPEATED VALUES

CROSS REFERENCE TO RELATED APPLICATION

This application is a continuation of U.S. application Ser. No. 12/848,862, filed Aug. 2, 2010, entitled BLOCK COMPRESSION OF TABLES WITH REPEATED VALLUES, and issued as U.S. Pat. No. 8,326,810 on Dec. 4, 2012, which is a continuation of U.S. application Ser. No. 11/805,186, filed May 21, 2007, entitled BLOCK COMPRESSION OF TABLES WITH REPEATED VALUES, and issued as U.S. Pat. No. 7,769,729 on Aug. 3, 2010, the disclosures of which are incorporated herein by reference.

BACKGROUND

The present disclosure relates to data processing by digital computer, and more particularly to block compression of tables with repeated values.

Search engines may search large amounts of data in database tables, such as relational tables, to find results. For massive amounts of data, such as a combination of tables containing millions of records, processing of the data may require lots of hardware resources. For example, large amounts of random access memory space may be needed to store all the records that are relevant to executing a user request.

SUMMARY

The subject matter disclosed herein provides methods and apparatus, including computer program products, that implement techniques related to block compression of tables with repeated values.

In one aspect, a column of data is compressed in accordance with dictionary-based compression to generate a column of value identifiers, the value identifiers are sorted, a list of block identifiers is generated, columns of block dictionaries are generated, and a block offset column is generated. For each block of the value identifiers, there is a unique block identifier for each unique value identifier and there are like block identifiers for like value identifiers. For each block dictionary, there is a list of block identifiers, where each block identifier is associated with a value identifier, and there is a block identifier existing in a block dictionary for each unique value of the block identifiers. Each value of the block offset column indicates an offset at which a block starts in the columns of block dictionaries.

In a related aspect, value identifiers representing a compressed column of data are sorted, and a block dictionary is generated. A block dictionary may be generated for each block of the value identifiers. Each of the block dictionaries may include a list of block identifiers, where each block identifier is associated with a value identifier and there is a block identifier for each unique value in a block.

The subject matter may be implemented as, for example, computer program products (e.g., as source code or compiled code tangibly embodied in computer-readable media), computer-implemented methods, and systems.

Variations may include one or more of the following features.

The value identifiers may be values representing structured business data having data dependencies across a same row of a table. The business data may include business objects modeled as sets of joined tables.

Block dictionaries, block vectors, and the like may be generated in parallel on multiple hardware servers.

Changes to a column of data may be stored in a delta buffer separate from the column of the data and the changes may be integrated asynchronously.

Block dictionaries, block identifiers (e.g., in a block vector or column of block vectors), and block offset values may be stored, and searches may be enabled on the block dictionaries.

A size of each block of the value identifiers may be a fixed number of rows.

A column of data may be sorted with other columns in a table of structured data. The sorting may include sorting the column of data to generate groupings of value identifiers, and selectively sorting blocks of succeeding columns based on previous columns, where a block of a succeeding column is sorted if a block of a previous column has a single, same value identifier.

A block identifier may be assigned for each of the value identifiers. An ordering of block identifiers may match an ordering of the value identifiers. Block identifiers may include a numbering sequence that commences for each block. Each block dictionary may be compressed according to a binary coding such that a minimal length of bits is used to represent block identifiers for each block dictionary. For a block dictionary, block identifiers may only exist once for each unique value of the block identifiers.

The subject matter described herein can be implemented to realize one or more of the following advantages. Efficient processing of mass amounts of database data, such as relational tables containing mass amounts of data, may require a high level of data compression to retain data volumes in installed memory (e.g., volatile memory) or on disk storage devices, and for efficient data flows when moving the data (e.g., from a hard disk drive to memory). Compression may have multiple effects in an information processing hardware landscape because reduced data volumes may require less installed main memory or hard disk capacity, and reduced data flows may place lower demands on processor cache, processor architectures, and on network bandwidth. All this may have a beneficial effect on hardware requirements, response times, and overall system performance. Data, such as business data, may be compressed and searched in memory, as significant compression of the data may allow for cost-effective in-memory processing of the data (e.g., a number of servers or amount of physical memory may be reduced). Compression may be achieved by generating vectors of block identifiers and compressed block dictionaries for one or more blocks of a column of data. Advantageously, multiple, frequently occurring values of a column of data may be represented in a compressed fashion by a combination of block dictionaries and vectors representing occurrence of values in blocks. To minimize space occupied by a block dictionary, a minimal amount of bits may be used to code block identifiers in a block dictionary. Block dictionaries may be reused across multiple blocks of data to decrease memory consumption of block dictionaries. Multiple columns of data may be compressed using block dictionaries and vectors of block identifiers. For structured data, data dependency relationships may be maintained by sorting columns of data based on other columns of data for which there are data dependencies.

Details of one or more implementations are set forth in the accompanying drawings and in the description below. Further features, aspects, and advantages will become apparent from the description, the drawings, and the claims.

BRIEF DESCRIPTION OF THE DRAWINGS

FIG. 1C is an example illustrating generation of result sets from main and delta indexes.

FIG. 6 is a block diagram of a table illustrating a sorting of data across multiple columns.

FIG. 9 is a block diagram of a table illustrating a sorting of data across multiple columns.

Like reference numbers and designations in the various drawings indicate like elements.

DETAILED DESCRIPTION

In general, in FIGS. 1-10, data may be compressed using a combination of techniques, which may be referred to as dictionary-based compression, bit vector compression (or, vector-based compression), sorting bit vector compression (or, shortened vector-based compression), and block vector compression. The data may be structured business data, where the data is structured in the sense that data may be attributes or key figures which are organized in a data structure, such as a table, and attributes or key figures may have dependencies. For example, in a table of information, a row may have dependencies among data in the row such that data in each of the columns of the row is associated with other data in other columns of the row. The data may form a sparse distribution in the sense that particular values such as null values of data may be instantiated exceedingly often across thousands or millions of rows either in part of the data structure, such as in certain rows in a table, or across the entire data structure. For example, a column of data having twenty million entries may include nineteen million null entries, where the nineteen million null entries are located in various rows that are not necessarily adjacent.

Figure 1A:
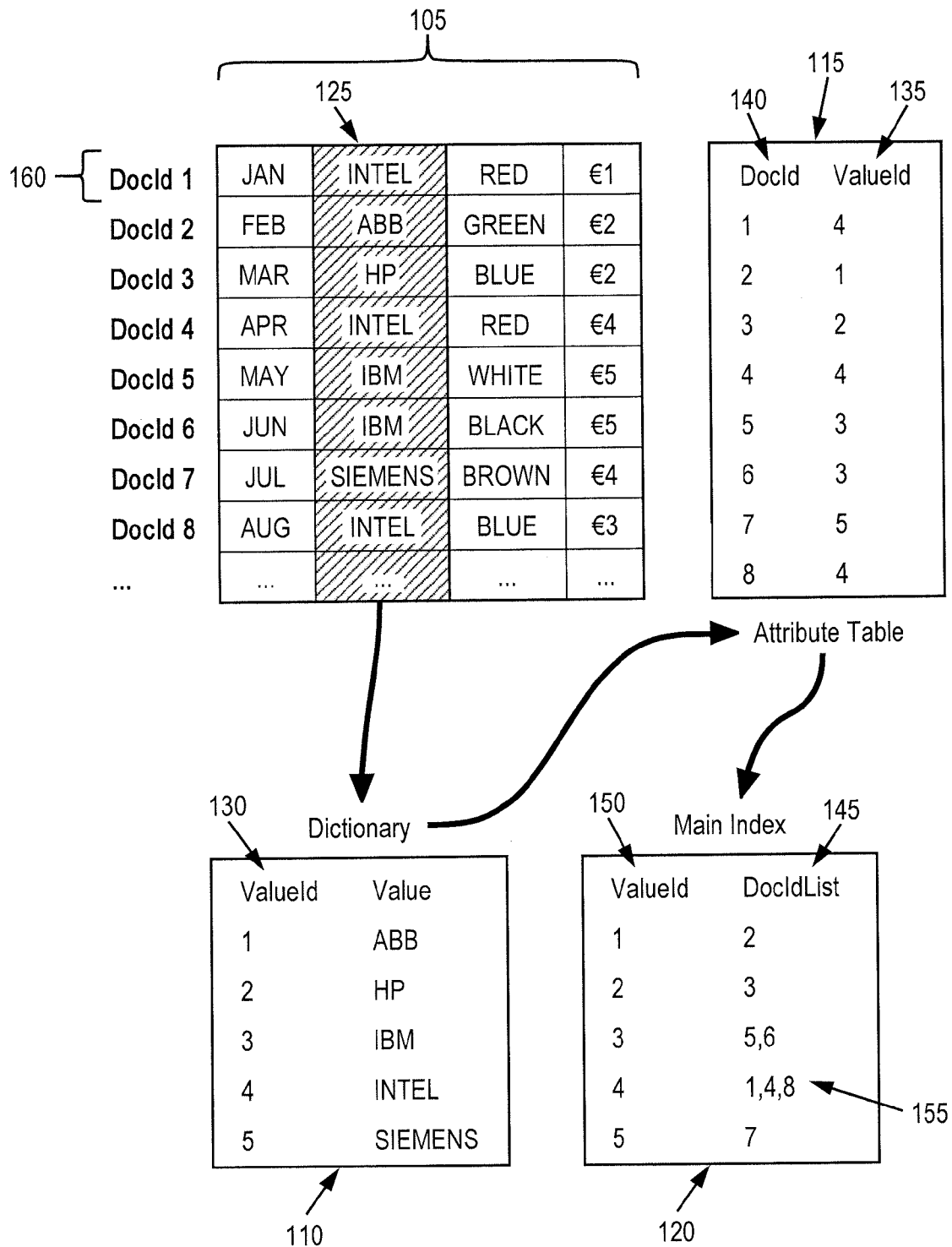
FIG. 1A is a block diagram illustrating a table of structured data, a dictionary for a column of the table, an attribute table, and a main index.

FIG. 1A is a block diagram illustrating a table 105 of structured data, a dictionary 110 for a column of the table, an attribute table 115, and an index 120. In general, FIG. 1A illustrates how a column 125 in the table 105 may be provided with the dictionary 110 that specifies value identifiers 130 (ValueIds) for the values in the column 125, the attribute table 115 listing value identifiers 135 for respective document identifiers 140 (DocIds), and the index 120 listing document identifiers 145 for respective value identifiers 150.

The dictionary 110 may be used to provide what may be referred to as dictionary-based compression, which may involve using the dictionary 110 to reduce an amount of data stored in a table by representing values in the table with identifiers that may take up less memory. In general, the dictionary 110 is a list, which may be sorted, of values appearing in a column and identifiers of the values (i.e., the value identifiers).

As an example, to reduce the memory or disk space occupied by a column from a data table by means of dictionary-based compression, a sorted list of different values appearing in a column may be generated and the different values may be numbered. The numbers (implemented, for example, as integers rather than strings that may represent the values themselves) may be used as placeholders for the values in the tables where the values appeared. The largest numbers needed to represent the values may be noted. If the cardinality C of a column is defined to be the number of different values appearing in it and if the total length of the column is N, then in a case where the value of C is much less than N, dictionary-based compression may bring benefits, such as reduced memory consumption in contrast to storing of the values in the table. A sorted list of C values may be referred to as a dictionary and may be used to look up the values of the numbers appearing in the table whenever these values need to be determined, for example, to return readable results to a user.

For example, the table 105 includes a column 125, which has values such as INTEL, ABB, and HP. The dictionary 110 includes value identifiers 120, which may represent the different values that may be in the column 125. For example, the attribute table 115 includes a value identifier for each row of the column 125. For example, the first row 160, referred to as document identifier 1 ("DocId 1"), includes a value INTEL that is represented in the attribute table 115 with the value identifier 4 based on the dictionary 110 having the value identifier 4 associated with the value INTEL. Values of the column 125 of the table 105 may be replaced with the value identifiers of the attribute table 115, which may reduce memory footprint of the data represented by the column 125. The value identifiers in the new table, along with the dictionary 110 may be used to reconstruct to the values of the column 125.

To facilitate value lookup and thus render contents of the column in a form that is more adapted for query execution, the index 120 may be generated and that index may replace the column 125. The index 120 is a table of lists of rows of the column 125 organized by their value identifier. For example, one list 155 indicates that a fourth value identifier is associated with rows 1, 4, and 8 of the column 125.

As an example of a memory impact of a table, a number of rows in a table T, such as the table 105 of FIG. 1A, may be equal to N being 1,000,000; and a number of bytes required to code each row may be 500, where 500 bytes is equal to 4,000 bits, which is equal to 4 kilobits. Without compression, the table T may require 1,000,000 times 500 bytes of space, which is equivalent to 500 megabytes of memory space; and, bandwidth required to move the table T in one second may be 4 gigabits per second.

As an example of how the data may be organized, a number of different values in column A of table T may be equal to a cardinality C of A being 250. In that example, the dictionary for column A may be a list of C values numbered by integers from 0 to 250. The binary representation of integers up to 250 may require eight bits (since two to the eighth power is equal to 256) which is one byte. For an example table T consisting of ten columns similar to column A, an average uncompressed column entry in any column occupies fifty bytes (500 bytes divided by ten columns is fifty bytes per column). The dictionary for column A may require about 100 kilobits (from the fact that 250 entries×(1 one byte value identifier plus 50 bytes to represent the corresponding value in a dictionary entry) is about 12 kilobytes, which is about 100 kilobits). Thus, with dictionary-based compression, column A may occupy 1,000,000 bytes, which is about one megabyte with a total space required by column A with dictionary-based compression being about 1.01 megabyte (space of compressed column plus corresponding dictionary); whereas a nominal space occupied by column A without compression may be 50 megabytes. So the compression factor may be about 50.

Figure 1B:
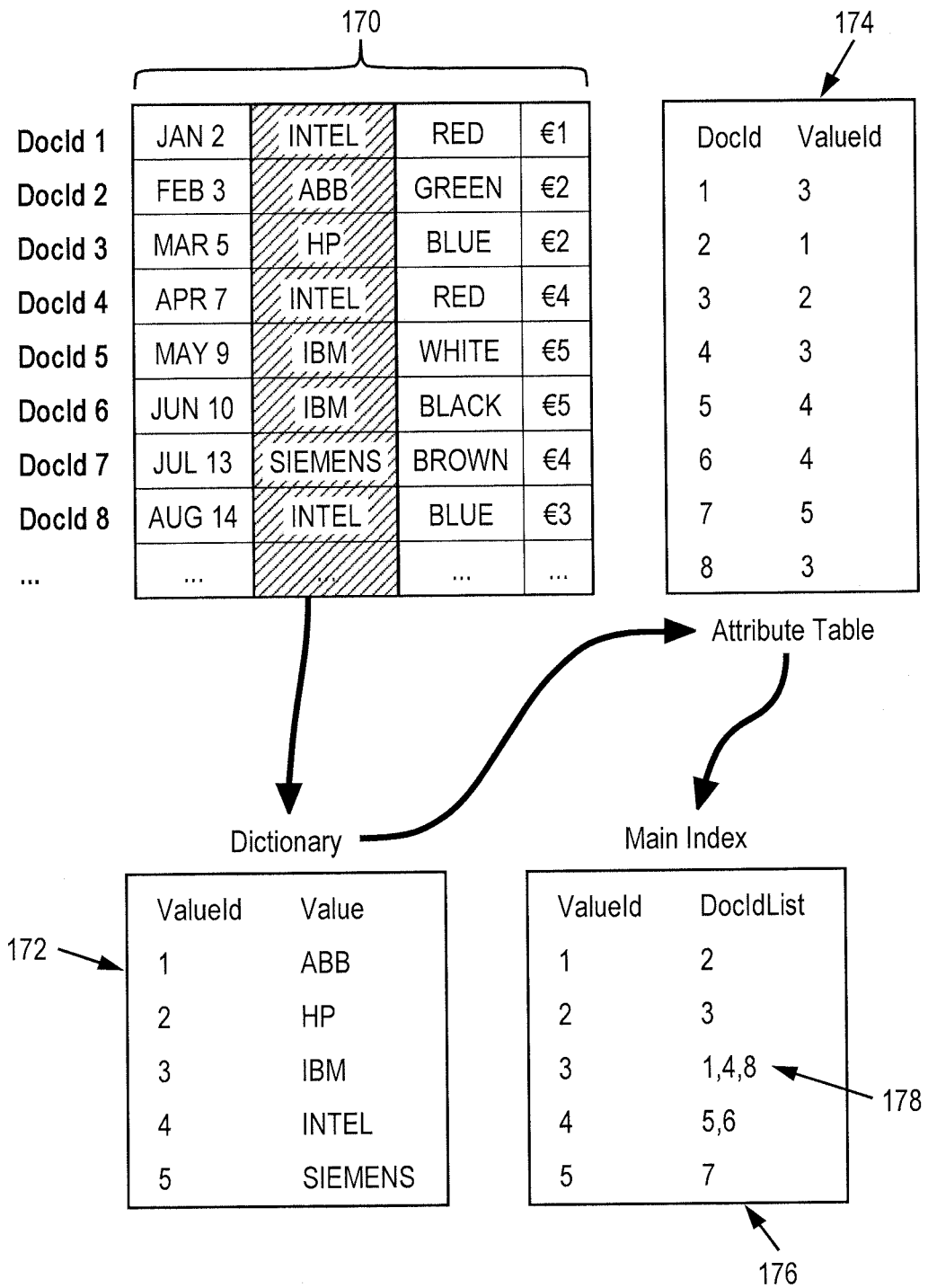
FIG. 1B is a block diagram illustrating a table of structured data, a dictionary for a column of the table, an attribute table, and a delta index.

FIG. 1B is a block diagram illustrating a table 170 of structured data, a dictionary 172 for a column of the table, an attribute table 174, and a delta index 176. In general, features of the block diagram of FIG. 1B may operate similarly to features of FIG. 1A. For example, both of the tables 105, 170 store records that may be compressed with dictionary-based compression using the dictionaries 110, 172 of FIGS. 1A and 1B, respectively, as described above.

In contrast to the block diagram of FIG. 1A, the block diagram of FIG. 1B includes the delta index 176, which may be used to store changes, which may include additions, modifications, or deletions, to data of a column. In particular, the delta index 176 includes a result of changes to data in a compressed column. The dictionary values of the delta index 176 may be chronologically ordered, as may be a case of a typical delta index. The chronological order may reflect an ordering of changes made to data over time, as indicated by associations of the values in the delta index 176 with indicated document identifiers. For example, the list 178 of document identifiers 1, 4, and 8, which are associated with the value identifier 3 may indicate that document identifier 1 was added before the document identifier 4, which was added before the document identifier 8. The chronological ordering of dictionary values of the delta index 176 may advantageously enable incremental writes without revision of previous entries.

The table 170 of FIG. 1B may reflect changes to, or deltas of, the table 105 of FIG. 1A. For example, each of the rows of the table 170 corresponding to the delta index 176 may represent a row to add to the table 105 corresponding to the main index 120. As another example, where a row in the table 170 has a same record identifier as a row of the table 105, the row in the table 170 corresponding to the delta index 176 may represent a replacement of the row in the table 105. As another example, a row in the table 170 may represent a difference between a row having a same record identifier in the table 105 (e.g., a positive or negative incremental difference in values in various columns of a same record).

Implementations of the delta index 176 may differ. For example, although FIG. 1B shows the delta index 176 as including dictionary-based compression of delta values, that need not be the case.

FIG. 1C is an example illustrating generation of result sets from main and delta indexes. For example, the delta index 176 may be used in conjunction with an index of compressed data of a column (e.g., such as the main index 120 of FIG. 1A), where the delta index 176 may store changes to data in the index. Both the delta index 176 and an index of compressed data of a column may be searched and results from the two sources may be merged to produce a composite result which reflects the changes made to the compressed data (e.g., as discussed below with reference to a delta buffer).

In the example, total revenue for a company (labeled "IBM") is calculated by finding the total revenue from the main index and incrementing it with the total revenue from the delta index. In particular, the command 180 "RETURN TOTAL REVENUE FOR IBM SALES" may be broken into two operations, by a server program, where the two operations include a first operation 182 for revenue for IBM from a main index (rows 5 and 6 of FIG. 1A correspond to a value identifier of 3, for "IBM," in the main index, having a total value of 11 euros) and a second operation 184 for revenue for IBM from a delta index (rows 5 and 6 of FIG. 1B correspond to a value identifier of 4, for "IBM," in the delta index, having a total value of 10 euros). And, results from those two operations may be merged by an operand 186, where merging may include incrementing the results of the main index with the results of the delta index. Increments may be positive or negative. Updates to entries in the main index may be handled by first canceling an old row then inserting the updated row, where the cancelation can in one implementation be represented by a negative increment in the delta index and the insert by a positive increment.

Figure 2A:
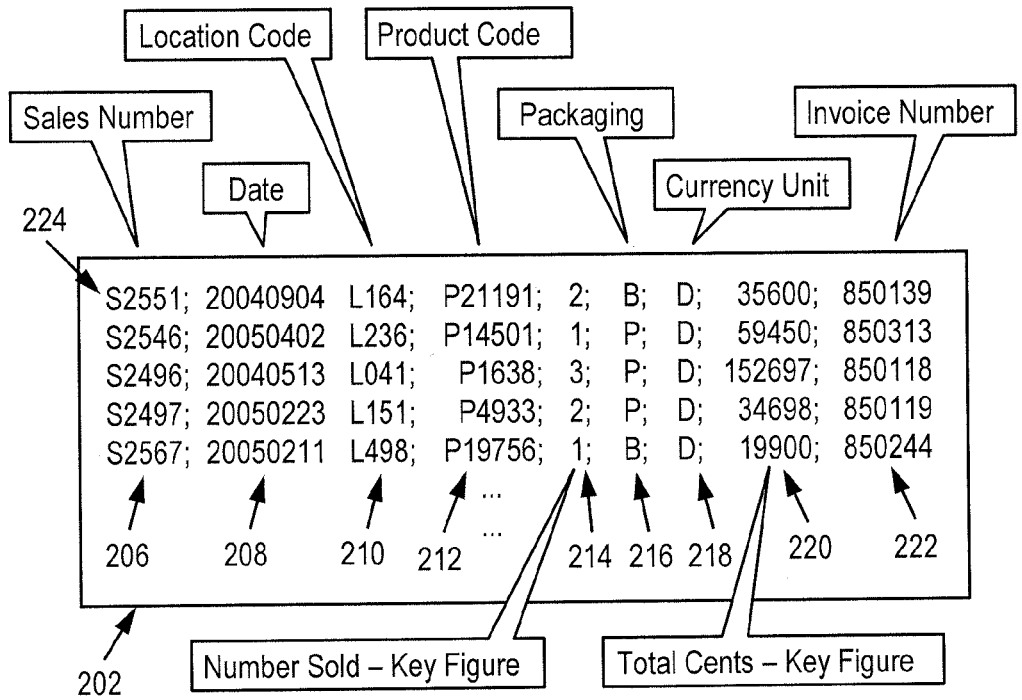
FIGS. 2A-2B are block diagrams illustrating tables of structured data.
Figure 2B:
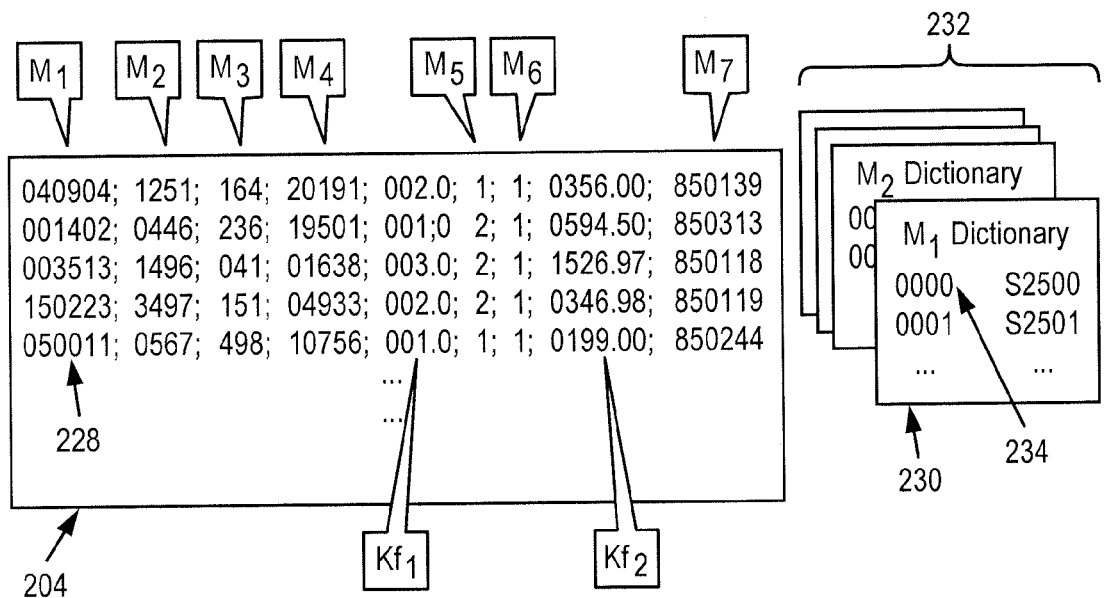

FIGS. 2A-2B are block diagrams illustrating tables 202, 204 of structured data. In general, a first table 202 represents an implementation of a sales table not being compressed according to dictionary-based compression and a second table 204 represents and implementation of the first table 202 being compressed in accordance with dictionary-based compression.

The first table 202 includes columns representing different types of data and rows representing different records based on a combination of the different types of data. For example, the columns represent sales numbers 206, dates 208, location codes 210, product code 212, a number of products sold 214, packaging attributes 216, a currency unit 218, a total value in cents 220, and an invoice number 222. The first row 224 includes a combination of information being a record, including, a sales number S2551, a date of 20040904, a location code of L164, a product code of P21191, and the like.

The second table 204 represents values of the columns 206-222 of the first table as dictionary-based compressed values. The types of compressed values include attributes, but not key figures (for reasons that may be irrelevant to compression of the values), and attributes are represented by identifiers in dictionaries 232. For example, values of the sales numbers 206 of the first table 202 are compressed as six digit integer values (which for up to about 250 thousand values may be represented by eighteen bit integer identifiers) in the first column 228 of the second table 204, where those integer values may represent a value in a first dictionary 230 but the number sold key figure values 214 of the first table 202 are not represented in a dictionary (and are represented as floating-point numbers for reasons that need not be relevant to compression of the values). A first sales identifier 0000 in the first dictionary 230 represents a value S2500 of the first column 228 of the second table 204.

Although FIGS. 2A-2B include a certain type of dictionary-based compression, such compression may differ. For example, although in the second table 204 of FIG. 2 key figures are not compressed according to dictionary-based compression, in some implementations a combination of key figures and attributes may be compressed according to dictionary-based compression, only key figures may be compressed, or a combination of select key figures and attributes may be compressed.

Figures 3, 4A:
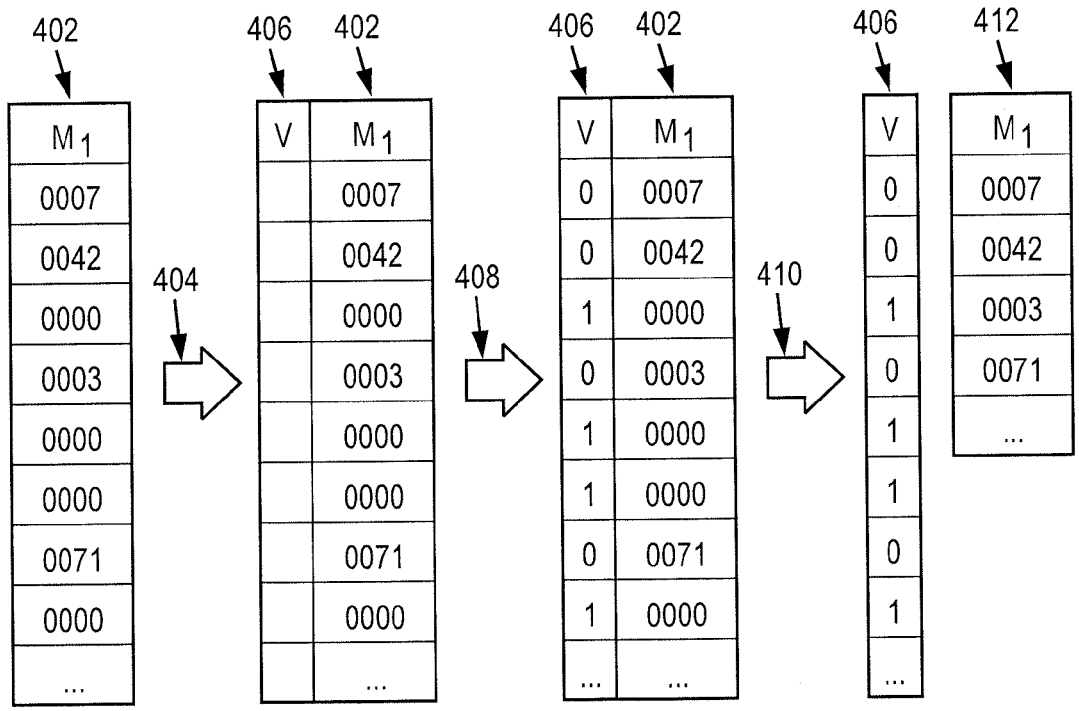
FIG. 3 is a table illustrating a cardinality of attributes and key figures.
FIGS. 4A-4B are block diagrams illustrating columns being compressed according to vector-based compression.

FIG. 3 is a table 300 illustrating cardinalities of attributes and key figures. For example, the table 300 may include a listing of cardinalities of respective columns of the first and second tables 202, 204 of FIGS. 2A, 2B. In addition to illustrating cardinalities, the table 300 includes for each cardinality the number of bits required to code the respective columns. For example, the number of bits required to code column M_3 of cardinality 3 is 2, since 2 to the second power is 4, which is the smallest integral power of 2 that is greater than or equal to 3.

The columns of the table 300 include a first column 305 identifying a column of another table, a second column 310 indicating cardinalities of values in associated columns, and, a third column 315 indicating numbers of bits required to code associated columns based on associated cardinalities. For example, a first entry 325 of the table 300 indicates that a column of attributes identified as M_1 has a cardinality of twenty four, which requires five bits to code in binary (since two to the fifth power is the smallest integral power of two that is greater than or equal to twenty four).

The table 300 may be used to reduce a memory impact of a table by generating column widths of values based on cardinalities of their values, which may be used in combination with dictionary-based compression.

Figure 4B:
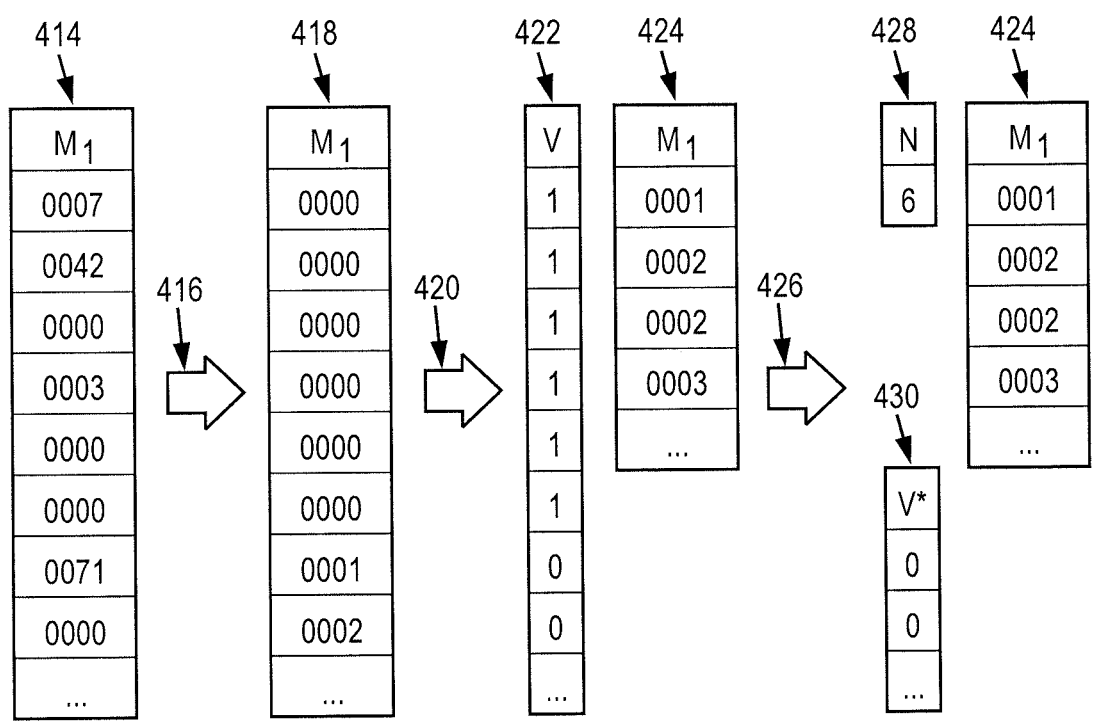

FIGS. 4A-4B are block diagrams illustrating columns being compressed according to vector-based compression. The compression may be referred to as bit vector compression. In general, the compression may involve finding a most frequent value in a column and representing the occurrence or non-occurrence of the value using a bit vector for the column. For example, a one may represent an occurrence of the value and a zero may represent a non-occurrence of the value. The compression may further involve generating a number of occurrences of a frequently occurring value and removing occurrences of the frequently occurring value from the bit vector to generate a smaller or reduced bit vector. For example, in contrast to the series of block diagrams in FIG. 4A, the series of block diagrams in FIG. 4B further includes reducing a bit vector of sorted values to a number of occurrences of a frequently occurring value and a shortened bit vector representing other values. The values in the columns of FIGS. 4A-4B may be dictionary-based compression values.

In the first series of block diagrams of FIG. 4A, a bit vector 406 is generated for a column 402 of values, as indicated by the first arrow 404. The bit vector 406 is populated with zeros and ones, as indicated by the second arrow 408, with zeros representing a non-occurrence of a frequently-occurring value 0000 and one representing an occurrence of the value. The frequently occurring value that is used to populate a bit vector may be a most-frequently occurring value or just a value that occurs more frequently than other values. Determining whether a value occurs frequently may be based on a tally of values from a scan of a column of data, or, statistical analysis of a value expected to occur most frequently (e.g., a null value may be expected to be a most-frequently occurring value in a table of exceptions where only exceptional values are non-null). The scope of occurrence for determining whether a value occurs frequently may be limited to a column of data (i.e., frequently occurring values may differ on a column by column basis). The column 402 of values may be compressed, as indicated by the third arrow 410, by removing occurrences of the most-frequently occurring value. For example, the value 0000 is removed from the column 402 to generate a compressed column 412. To reconstitute values from the column 402 based on the compressed column 412, the bit vector 406 may be used to indicate positions of values in the compressed column 412 and positions of a frequently occurring value.

For example, once dictionary-based compression has been performed, further compression can be achieved by deploying bit vectors for relevant columns as follows. For a given column A containing a frequently repeated value, such as a null value, a most frequent value F may be found in column A and coded using a bit vector V for the column. The bit vector V may have N terms, where N is a positive integer representing a number of rows in column A. If V is written as a column beside column A, V may include a 1 beside each appearance of value F in A and a 0 beside any other row in A. The bit vector V may be separated from the column vector A and all rows including value F may be deleted from A to generate a compressed column vector A*. The column A may be reconstituted from the compressed column vector A* by reinserting values F as specified by the bit vector V, and the uncompressed column of readable values can be reconstituted from A by using a dictionary as specified through a dictionary-based compression technique.

As an example of how reduction in memory may be realized, for an example table T with N equal to 1,000,000 rows and having a column A, let the most frequent value F in column A appear 990,000 times in A. The other 10,000 values in A may be taken from the remainder of the set of different values listed in the dictionary for A, which may contain a total of C being 250 different values. In this example, the bit vector V for column A may contain 1,000,000 bits, which is about 1 megabit, which is about 125 kilobytes. A compressed column A* may include 10,000 entries, where each is coded with 8-bit (i.e., 1 byte) integers, to give a space occupancy of 10 kilobytes (i.e., 10,000 entries×1 byte). A total space required by column A without compression may be 50 MB (as discussed with reference to a non-compressed example column A). A total space required with vector compression may include space for a dictionary, space for the compressed column A*, and space for the bit vector V. Total space required by a vector-based compression version of column A may be 147 kilobytes (12 kilobytes for the dictionary, 10 kilobytes for a compressed column, and 125 kilobytes for a bit vector). A compression factor of about 340 may be realized (i.e., 50,000 kilobytes uncompressed/147 kilobytes compressed in accordance with a vector-based compression implementation).

In contrast to the first series of block diagrams of FIG. 4A, the second series of block diagrams of FIG. 4B involves sorting a column of data to assist in generating an amount representing a number of occurrences of a frequently occurring value. In the second series of block diagrams of FIG. 4B, a sorted version of a column 414 is generated as shown by a first arrow 416 to the sorted column 418. Then, a frequently occurring value is represented by a bit vector 422 and the sorted column 418 has the frequently occurring value replaced, as shown by a second arrow 420 to the bit vector 422 and the reduced column 424, which has a frequently occurring value 0000 removed. A number 428 representing an amount of occurrences of a frequently occurring value is generated as shown by a third arrow 426. In addition, the bit vector 422 is reduced to remove a grouping of the frequently occurring value to generate the reduced, or shortened, bit vector 430. As some data might not be sorted to the front or top of bit vector 422, the shortened bit vector 430 may be used to determine whether a frequently occurring value occurs later in the reduced column 424. For example, dependencies among data across various columns, sorting rules, or a combination of factors might prevent a value of a column from being sorted to a grouping of a frequently occurring value. To reconstitute a full column, the number 428 of occurrences of the value in a grouping and the shortened bit vector 430 may be used, in combination with the reduced column 424.

For example, once a table has been compressed by means of dictionary-based compression and vector-based compression, a further level of compression may be possible in cases where many columns have many instances of frequently occurring values (e.g., many null or zero values). Rows in the table may be sorted to bring as many of the most-frequently occurring values in columns to a top of their columns as possible (e.g., as described with reference to table 600 of FIG. 6), and bit vectors may be generated for the columns. The topmost blocks of frequently occurring values may be replaced in the bit vectors by numbers recording how often frequently occurring values appear in the blocks (e.g., as shown by the number 428 of FIG. 4B). The use of the number may allow for bit vectors to be shortened and an increase of an overall compression ratio.

As a more detailed example, an example table T may have M columns with a most-frequently occurring value in column 1 being $F\_1$, a most-frequently occurring value in column 2 being $F\_2$, and the like to $F\_M$, where a number of occurrences of a value $F\_J$ in a column J may be written as $|F\_J|$ and the column J may be any of the columns (i.e., any of the columns from 1 to M). The columns may be numbered such that a column ordering is given by the frequency of the most frequent values F, so that the column with most F values is first and the column with fewest F values is last. Thus, columns 1 to M may be numbered such that $|F\_1|>|F\_2|>\ldots>|F\_M|$ (e.g., as may be the numbering of columns 602 in table 600 of FIG. 6).

The rows of table T may be sorted by column 1 such that all values $F\_1$ are on top. The sort order may be indifferent to an internal ordering of the top $|F\_1|$ rows, which may be sorted by column 2 such that all values $F\_2$ are on top. The sort order may now be indifferent to an internal ordering of the top block of rows with value $F\_2$, such that these rows are sorted by a column 3 such that all values $F\_3$ are on top. The sorting of rows may continue until a topmost block of rows with value $F\_(M-1)$ are sorted to put values $F\_M$ on top (e.g., continued for all but the last column M). All the $F\_1$ rows may be on top, with a large number of the $F\_2$ rows on top, somewhat fewer $F\_3$ rows on top, and so on, with decreasing completeness (e.g., as depicted in table 600 of FIG. 6). This manner of sorting might not be a theoretically optimal sorting for maximizing a final compression ratio, but may be relatively easy to implement, such that it runs faster than a more complex approach (e.g., more efficiently utilizes processing resources), and may often be close to an optimal sorting.

Follow the detailed example, bit vectors $V\_1$ to $V\_M$ may be written for the columns 1 to M, where each bit vector $V\_J$ for a column J includes '1' values for an occurrence of values $F\_J$ and '0' values for any other value. The result may be a set of bit vectors $V\_J$ that each start with a solid block of values $F\_J$. For each $V\_J$, the solid block of values $F\_J$ and write in their place a number $n\_J$ recording how many bits were deleted in $V\_J$. For sparse tables T (i.e., tables having a frequent occurrence of a most-frequent value where instances of the value are not necessarily adjacent), space occupied by a shortened bit vectors $V*\_J$ plus the numbers $n\_J$ may be significantly less than space occupied by a full bit vectors $V\_J$.

Shortened vector-based compression may greatly improve efficiency of aggregation of columns of values. For example, in cases where all the frequent values $F\_J$ are zero, aggregating the values of initial segments with a length $n\_J$ of the columns may be trivial (e.g., as $n\_J \times zero$ is zero), and code exploiting this triviality may be much cleaner and faster than would have been the case without the shortened vector-based compression.

As an example of how much compression may be realized, let a table T again be as described above, with N being 1,000,000 rows; the table having 10 columns $A\_1$ through $A\_{10}$; a most frequent value $F\_1$ in column $A\_1$ appearing 990,000 times; and another 10,000 values in $A\_1$ containing a total of 250 different values, each at 1 byte. Without shortened vector-based compression, but with vector-based compression column $A*\_1$ for a most-frequently occurring value $F\_1$ may occupy 10 kilobytes and a bit vector $V\_1$ may occupy 125 kilobytes.

With shortened vector-based compression, a shortened bit vector $V*\_1$ may contain 10,000 bits and occupy 1.25 kilobytes. The number $n\_1$ representing the block of 1 bits for $V\_1$ for the sorted column $A\_1$ may be in decimal notation 990,000 and require 20 bits in binary notation (i.e., less than 3 bytes). Total space required by $A\_1$ compressed with shortened vector-based compression may include space for a dictionary, space for the short column $A*\_1$, space for the short bit vector $V*\_1$, and space for the number $n\_1$. So the space for $A\_1$ with shortened vector-based compression may be less than 27 kilobytes (12 kilobytes, 10 kilobytes, 1.25 kilobytes, and 3 bytes).

As described above, total space required by a column $A\_1$ without compression may be 50 megabytes. With shortened vector-based compression, a compression factor may be greater than 1800 (50,000 kilobytes/27 kilobytes, suitably rounded). Compression factors for other columns having shortened vector-based compression, such as columns $A\_2$ to $A\_{10}$ may be less, depending on how many of the values $F\_J$ for J being from 2 to 10 are sorted to the tops of their columns, but for sparse tables the overall compression factor can still be high enough to make such compression well worthwhile, even allowing for the overhead code required to reconstruct the columns and read out selected values on demand.

For both vector-based compression and shortened vector-based compression, some overhead resource consumption (including but not restricted to processing and memory consumption) may be required to compress and decompress columns, and to facilitate efficient reads of values in a column without decompressing an entire column. The additional overhead may take both space (including but not restricted to main memory space) and time (e.g., measured in terms of percentage utilization of processor core resources) to run, and the penalty might be considered in setting thresholds for an employment of shortened vector-based compression (e.g., in contrast to vector-based compression, dictionary-based compression, or neither). The thresholds may be set heuristically and by testing on various tables. In implementations involving tables containing mass amounts of data, a selection of compression techniques may be used (e.g., different techniques for different columns) to minimize memory consumption in lieu of processing consumption. By minimizing memory consumption, fewer hardware resources, such as a number of blade servers and an amount of installed physical memory, may be required. In addition, overall speed of compressing data and responding to queries may be improved as a minimal memory footprint may allow for compressing and searching of data in main memory (e.g., volatile memory, such as random-access memory, having a response time quicker than a secondary memory, such as a hard disk drive used for persistent storage), and processing overhead for implementing compression may be acceptably small.

Figure 5:
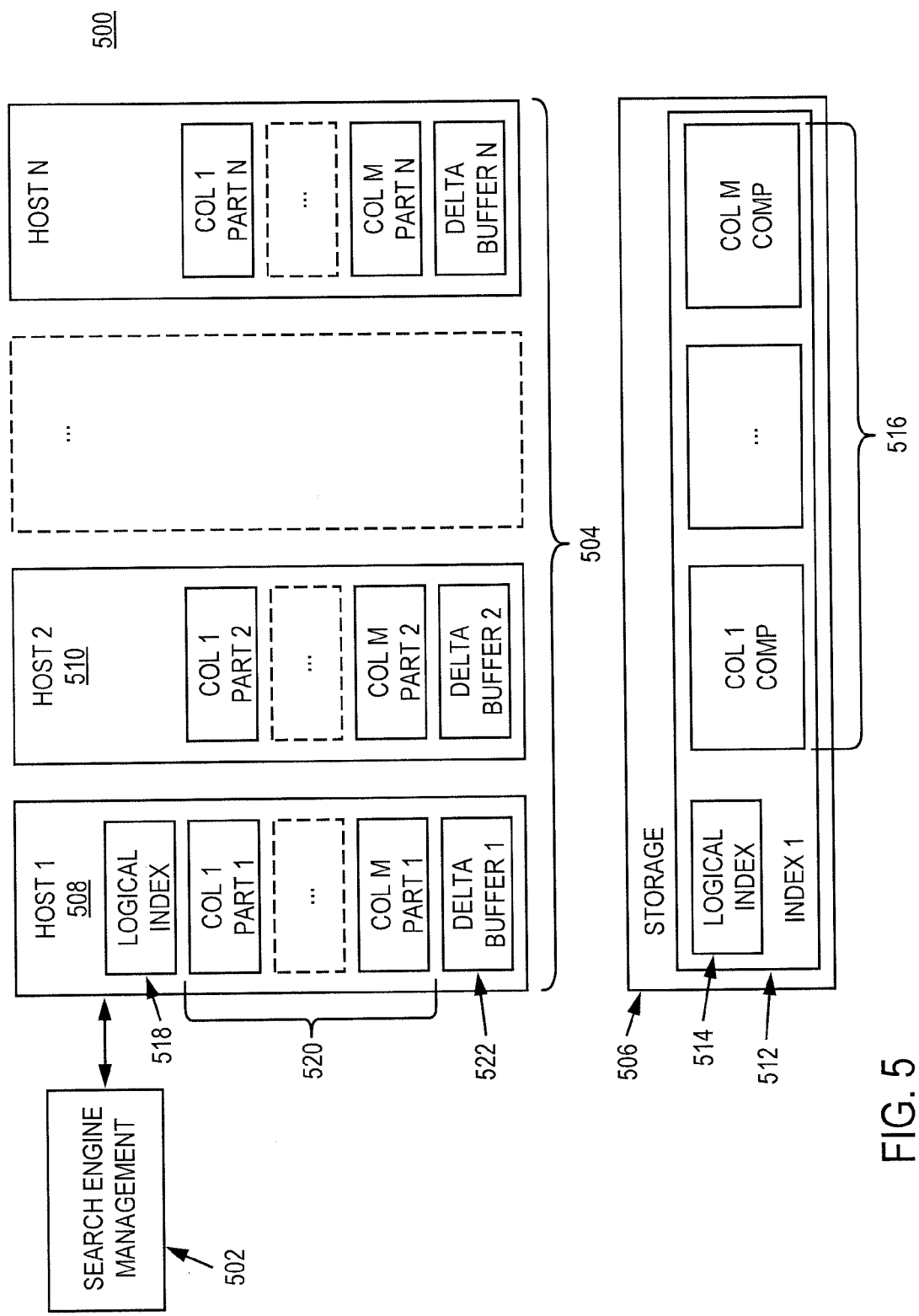
FIG. 5 is a block diagram illustrating a system to compress data and search compressed data.

FIG. 5 is a block diagram illustrating a system 500 to compress data and search compressed data. The system 500 includes a search engine management tool 502, hosts 504, and storage 506. In general the system 500 may be used to search compressed data of the hosts 504 using the search engine management tool 502, and the data may be organized and compressed by the hosts 504. In addition, the data held in memory at the hosts 504 may be persisted at the storage 506, in either compressed or uncompressed form. The search engine management tool 502 may be an integrated service with the services that perform searching and compression, implemented redundantly on each of the hosts 504 (for example in such a manner as to provide mutual monitoring and backup).

The hosts 504 may be organized such that each of the hosts 504 holds a portion of rows of data. For example, a first host 508 may hold a first million rows and a second host 510 may hold a second million rows. Distribution of rows of data across the hosts 504 may be uniform, which may improve parallel processing. For example, this may be done to improve parallel processing to decompress, search and recompress rows of data across the hosts 504. As a result of the distribution of data, each column of a series of columns from one to M, with M being a positive number, may be split into parts one through N, with N being a positive integer, and one part being allocated to each host where each host is responsible for the portion allocated to that host (e.g., responsible for indexing and compression or for decompression, search and recompression of an allocated portion).

A logical index for a table of data may be stored at one of the hosts 504 and that logical index may be used to determine where data resides across the hosts 504 and to coordinate processing. For example, the first host 508 includes a logical index 518 that may indicate where rows of data are located across the hosts 504. As an example of coordinating processing, the search engine management tool 502 may query the first host 508 for results responsive to a search and the first host 508 may use the logical index 518 to coordinate searching of the hosts 504 and merging results to provide to the search engine management tool 502.

The hosts 504 may be blade servers that share the storage 506. The storage 506 may include an index, such as a first index 512, corresponding to each of one or more tables from a database for which the data is compressed at the hosts 504. For example, the tables may be fact tables and dimension tables for a multidimensional OLAP (OnLine Analytical Processing) cube. The indexes may contain a logical index with metadata for an index structure and a set of compressed columns. For example, the first index 512 includes a logical index 514, which may include metadata for the data of the hosts 504, and a set of compressed columns 516.

Each of the hosts 504 may be responsible for compressing rows of data for which they are responsible. For example, the first host 508 may be responsible for compressing rows of data in the compressed columns 520. The compression that is performed may be any of the types of compression described in this document. A compression scheme, such as shortened vector-based compression, may be stored with each index at a host and coordinated by a logical index in the case of a split index.

Each of the hosts 504 also includes a delta buffer. For example, the first host 508 includes a first delta buffer 522. The delta buffers may store any changes to a respective index part of a host. For example, the first delta buffer 522 may store changes to data stored in the columns 522 of data for a first part of a table. The delta buffers may be used to store changes to data in the hosts 504 instead of requiring updates to the data in response to each change (e.g., updates may be asynchronous to avoid hampering performance during queries on the data). That the compressed columns need not be updated for individual changes may allow for compression to improve overall system performance to a greater degree than if changes were written synchronously to the stored columns. For example, processing overhead associated with integrating updates may be reduced if updates are accumulated in the delta buffers and the accumulated updates used to update the main indexes on a less frequent basis, since then the overhead resources for compressing the updated main index are also consumed on a less frequent basis. For example, instead of making a thousand small updates to a column index and having to decompress and recompress the index each time, the thousand updates can be written to the delta buffer and then all written together to the main index, so that only one cycle of decompression and recompression is required, thus achieving a thousand-fold reduction in overhead resource consumption. To find search results, the delta buffer may be searched along with the compressed data in a main index and results from the delta buffer may be merged with results from the main index to generate results that incorporate changes. In some implementations, depending on implementation and configuration details, each of the hosts 504 may also include one or more delta buffers, for example, a delta buffer for each index.

FIG. 6 is a block diagram of a table 600 illustrating a sorting of data across multiple columns 602. Each of the rows 604 includes values that are dependent across the columns 602. For example, a first row 608 includes a combination of values for structure data that represents a business object where each of the values in the first row 608 are dependent on other values in the first row 608 such that a sorting of the first column 610 sorts data in the other columns such that the combination of the values of the first row 608 is maintained. The business objects may be modeled as sets of joined tables. The modeling as a set of joined tables may be a result of business objects being defined in such a way that they can be modeled as sets of joined tables, so a search engine may manipulate the objects by searching over rows of the tables and calculating specified joins of the business objects.

The data in the table 600 may be dictionary-based compression values. The data in the table 600 may be a result of a sorting the data to group most-frequently occurring values in preparation of a vector-based compression technique. For example, the value 0 may be a most-frequently occurring value for each of the columns 602 and the rows may have been sorted such that groupings of the value are generated at a top most portion of the columns 602.

The sorting of the rows 604 in the table 600 may have taken into account a most-frequently occurring value across the columns 602. For example, a summation row 606 indicates a number of occurrences of a most-frequently occurring value for each of the columns 602. The columns 602 may have been ordered such that a most-frequently occurring value of the first column 610 occurs more frequently than other frequently occurring values of each of the columns 602, and, most-frequently occurring values of other columns are also ordered such that values occurring more frequently across the column are ordered from A_2 to A_9. Based on a sorting of columns, the rows may be sorted to generate as many frequently occurring values in groups at one end of a row, and that sorting may take into account dependencies across columns.

For example, the columns may be ordered horizontally as A_1 to A_9 by how many 0 values they contain, as shown by the summation row 606. The first column 610, labeled column A_1, may have all of its rows sorted to bring all the 0 values to the top. Then, a second column 612, labeled column A_2, may have rows 1 to 19 sorted to bring the 0 values of those rows to the top. The sorting of the second column 612 being restricted to rows 1 to 19 may be based on maintaining the sorting order of the top most values of the first column 610 and dependencies of data across a row of data. For example, as rows 1 to 19 of the first column 610 includes the most-frequently occurring value of that column, to maintain the grouping of the most-frequently occurring value in rows 1 to 19, only those rows may be sorted in the second column 612. This technique of sorting may be followed for each of the remaining columns. For example, the third column 614, labeled column A_3, may have rows 1 to 15 sorted to bring 0 values of those rows to the top, where 0 values of other rows may maintain their position (e.g., row 17 includes a 0 value). As other examples, a fourth column 616, labeled column A_4, may have rows 1 to 14 sorted to bring 0 values to the top of those rows; a fifth column 618, labeled column A_5, may have rows 1 to 10 sorted to bring 0 values of those rows to the top; a sixth column 620, labeled column A_6, may have rows 1 to 8 sorted to bring 0 values of those rows to the top; a seventh column 622, labeled column A_7, may have rows 1 to 7 sorted to bring 0 values of those rows to the top; an eight column 624, labeled column A_8, may have rows 1 to 6 sorted to bring 0 values of those rows to the top; and, a ninth column 626, labeled column A_9, may have rows 1 to 4 sorted to bring 0 values of those rows to the top.

Each of the sorted columns may be compressed using vector-based compression, such as the shortened vector based compression described with reference to FIG. 4B. The sorting of columns may optimize memory savings of compression by pushing larger blocks of frequently occurring values to one end of a column, such that, for example, shorter bit vectors may be generated with the sorting than may be generated without such sorting.

Although the table 600 includes a certain organization of data that may be a result of a sorting, sorting may differ and the data may differ. For example, although a same value, 0, is a most-frequently occurring value for each of the columns 602, tables may differ and different values may be a most-frequently occurring value for each of the columns 602. As another example, a most-frequently occurring value for one column may be used for sorting all of the columns, or all of the columns need not be sorted.

Figure 7A:
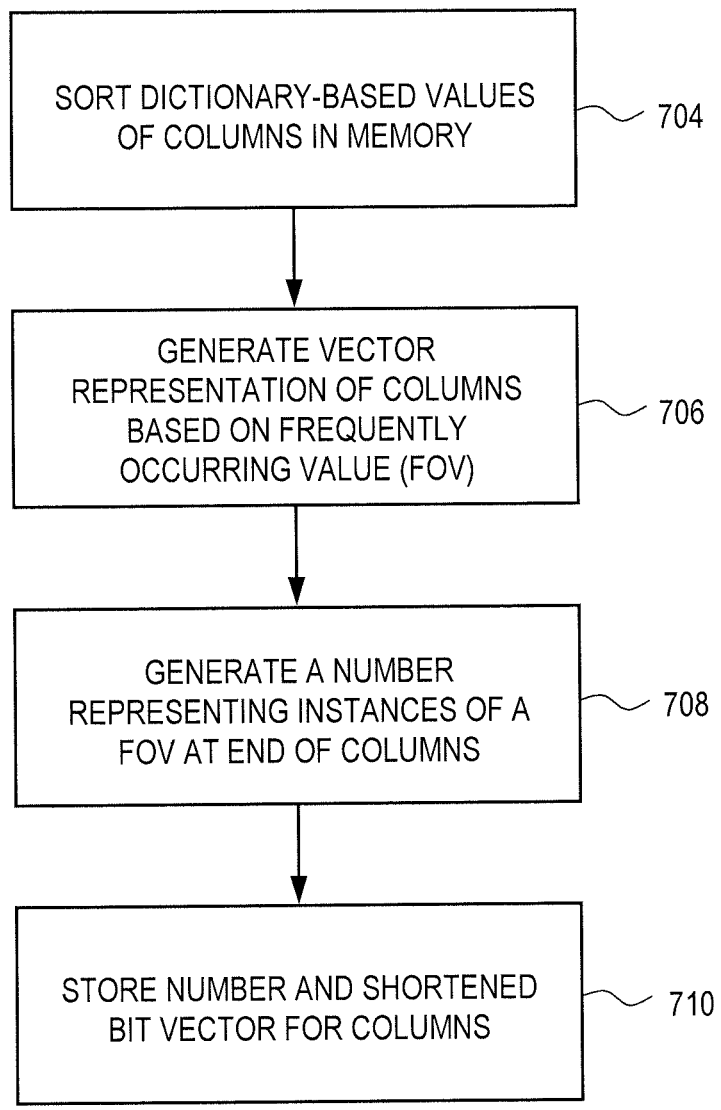
FIGS. 7A-7B are flowcharts illustrating processes of compressing data and enabling searches of compressed data.
Figure 7B:
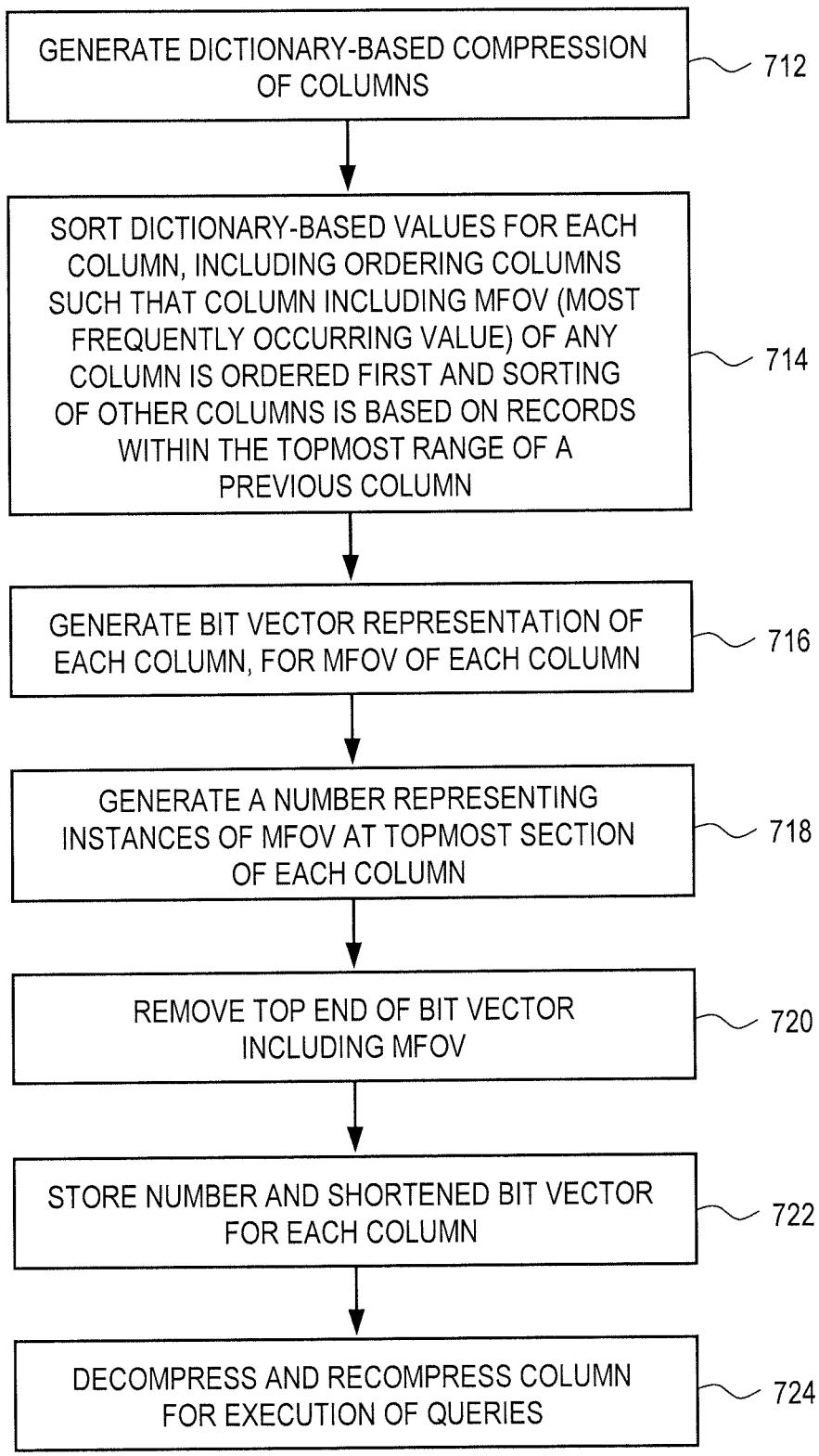

FIGS. 7A-7B are flowcharts illustrating processes 700, 702 of compressing data and enabling searches of compressed data. The processes 700, 702 may be implemented by the hosts 504 of FIG. 5. For example each of the hosts 504 may perform the process 700 on a portion of data for which a host is responsible. The data that is compressed may be structured business data. The data may be compressed and searched in memory, as significant compression of the data may allow for cost-effective in-memory processing of the data (e.g., a number of servers or an amount of physical memory may be reduced).

In general, in the process 700 of FIG. 7A, dictionary-based values of columns of data in memory are sorted (704), vectors representing frequently occurring values of the columns are generated (706), numbers representing frequently occurring values are generated (708), and the numbers and shortened vectors are stored (710).

Sorting of dictionary-based values (704) may involve sorting from a lowest value to a higher value for one or more columns of values. If values of multiple columns are sorted, the sorting may involve sorting some columns before others based on an ordering of columns (e.g., an ordering based on a number of most-frequently occurring values in columns of a table). For example, the sorting of columns 602 based on the order of the columns 602 described with reference to the table 600 of FIG. 6 may be performed. The sorting may take into account dependencies of data across columns. For example, the dictionary-based values may represent data that is structured with dependencies across columns for a same row and an association of values in a row may be maintained. The sorting may take place in a server, such as one of the hosts 504 of FIG. 5.

For example, sorting dictionary-based values may involve, for each column of a table, ordering columns such that a column including a most-frequently occurring value (MFOV) of any column is ordered first and sorting of other columns is based on records within the topmost range of a previous column (714).

Vectors representing frequently occurring values of the columns are generated (706). The vectors may be bit vectors that represent the occurrence or non-occurrence of a frequently occurring value in a row with a bit. The vectors may be generated for all of the columns or for only some of the columns. The vectors may be generated for parts of a column by each server responsible for a portion of data (e.g., respective hosts of the hosts 504 of FIG. 5). A frequently occurring value might be, but need not be, a most-frequently occurring value, such as a most-frequently occurring value within a scope of a column. For example, a bit vector representation for a most-frequently occurring value of each column may be generated (716).

Numbers representing frequently occurring values are generated (708). Each of the numbers may represent a number of occurrences of a frequently occurring value in a column. For example, FIG. 4B includes a number six (428) indicating six occurrences of a frequently occurring value 0000. The number of occurrences may be limited to a number of occurrences in a group of the frequently occurring value at one end of a column (e.g., at a top or bottom). For example, one column may have a group of a frequently occurring value at a top, the number may represent the number of occurrences of the value in that group, and the column may include other instances of the value. For example, a number representing instances of a most-frequently occurring value at a topmost section of each column may be generated (718).

Numbers and shortened vectors are stored (710). For example, the number representing occurrences of a frequently occurring value may be stored with a shortened vector. For example, a set of a number and a bit vector may be stored for each column of a table. The shortened vector may be a vector representing occurrences of the frequently occurring value with the occurrences of the value represented by the number removed from the vector to generate the shortened vector. In addition to storing the shortened vector, instances of the frequently occurring value in the group of the value may be removed from a column to generate a shortened or reduced column. For example, top ends of bit vectors including most-frequently occurring values may be removed (720), and numbers representing the number of occurrences of most-frequently occurring values and shortened bit vectors for each column may be stored (722). Also, the top end of a column including a group of most-frequently occurring values may be removed or all instances (e.g., topmost and other instances, if any) of a most-frequently occurring value may be removed to generate a shortened column (and, e.g., may be reconstituted using the bit vector).

In general, in addition to implementations of sub processes of process 700 of FIG. 7A, the process 702 of FIG. 7B further includes generating dictionary-based compression values (712; e.g., as described with reference to FIG. 1A), shortening vectors representing values of columns (720; e.g., as described in the above paragraph), storing a compressed column in memory (722), and decompressing and recompressing a column as required to execute queries (724).

Performing a search on a compressed column may involve loading data of a compressed column into memory (e.g., non-volatile memory from compressed data in a persistent storage), decompressing the data to a temporary structure, and selecting rows as specified by the search.

Although the processes 700, 702 of FIGS. 7A and 7B include certain sub-processes in a certain order, additional, fewer, or different sub-processes may exist and those sub-processes may be in a different order. For example, a column may be sorted based on bit vector representations of most-frequently occurring values of a column, rather than sorting an entire column (e.g., only values most-frequently occurring may be sorted to one end of a column and other values need not have a sorting among them).

As another example, dictionary-based compression, general vector-based compression, and shortened vector-based compression may be applied based on determinations as to whether a type of compression, if any, is expected to optimize performance (e.g., reduce memory consumption). For example, dictionary-based compression might be performed if dictionary-based values and a dictionary are expected to consume less memory than non-dictionary-based values of a column. As another example, only rows having attributes but not key figures may be compressed using any type of compression.

Figure 8:
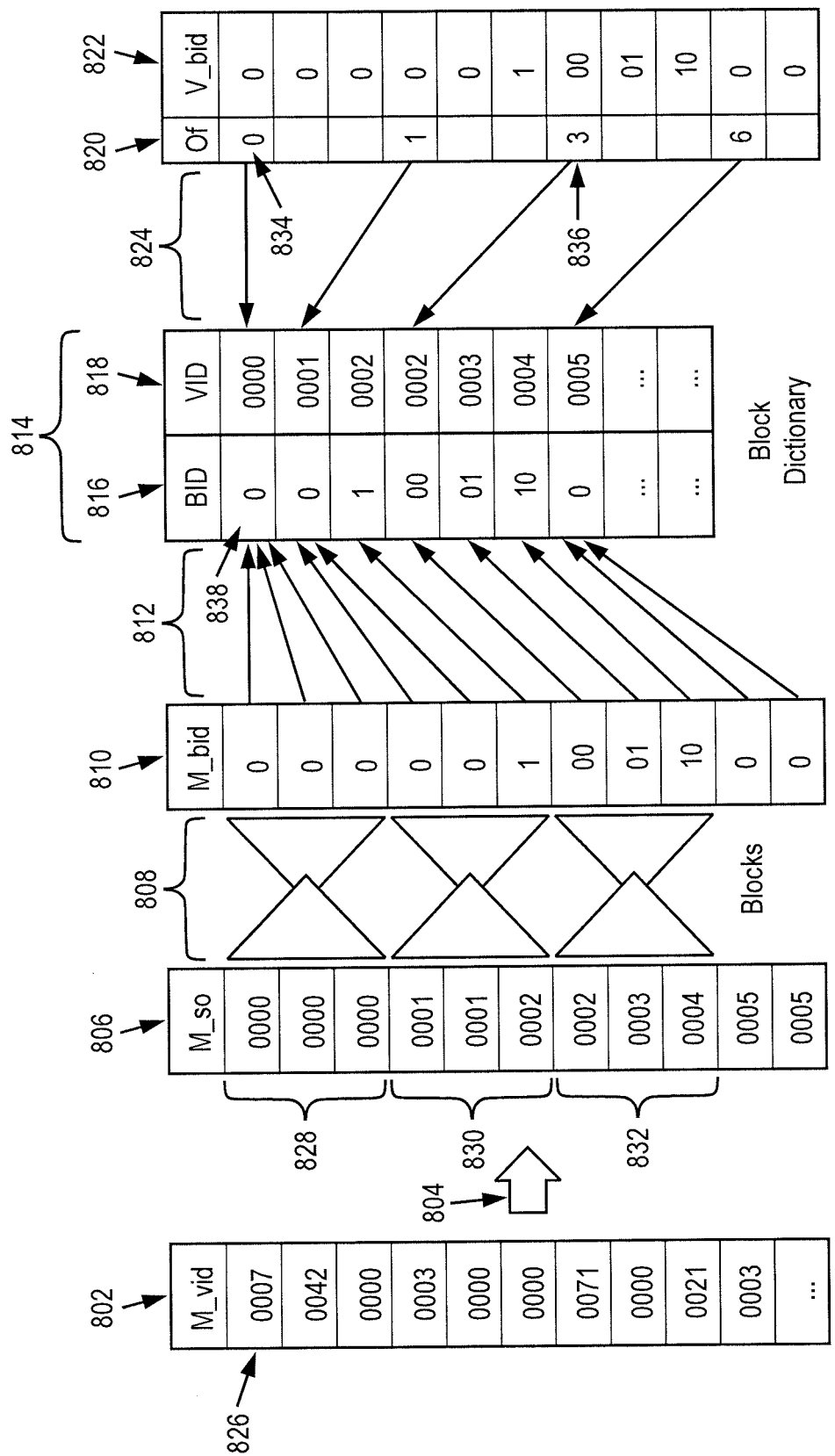
FIG. 8 is a block diagram illustrating compression of a column of data using compressed dictionaries.

FIG. 8 is a block diagram illustrating compression of a column of data using compressed dictionaries. The diagram includes columns 802, 806 of compressed data, a vector 810 of block identifiers, columns 814 of block dictionaries, and a column 820 of offset values corresponding to the block dictionaries.

The compression illustrated in FIG. 8 may be referred to as "block vector compression," as blocks of data may be compressed to one or more vectors of block identifiers. The compression may be referred to as being blockwise as compression of data is applied to blocks of data, such as blocks of rows. The compression may use dictionary-based compression and might be an alternative to the techniques of vector-based compression and shortened vector-based compression described above. The compression described with reference to FIG. 8 may be applied as an alternative when one or more columns contain several values that are each repeated many times in a respective column; in contrast to, for example, having only one value repeated many times. The compression may be particularly applicable for compressing millions or billions of rows, where memory efficiencies achieved may significantly outweigh detriments caused by processing overhead for the compression.

In general, the compression of FIG. 8 involves dividing a sorted column of data into blocks and creating a vector of block identifiers referring to a block dictionary for each block. A block dictionary may contain just the values that appear in the block. Block identifiers may be coded using a minimal number of bits (e.g., binary coded with a bit length being a minimal amount required to binary code all unique block identifiers of a block). A block dictionary may map each block identifier to a value identifier representing a unique value in a column of data. Value identifiers may be looked up in a column dictionary created by dictionary-based compression (as described above with reference to dictionary-based compression).

Referring to FIG. 8, a first column 802 of compressed data includes value identifiers representing data that has been compressed in accordance with dictionary-based compression. For example, a value identifier "0007" may represent a character string "INTEL." The first column 802 of compressed data may be sorted to generate a second column 806 of compressed data, as indicated by the arrow 804. The second column 806 of compressed data is sorted such that same value identifiers are grouped together. Although the sorting of the second column 806 of compressed data includes a sorting from lower-numbered value identifiers to higher-numbered value identifiers, other sorting techniques may be used which result in multiple value identifiers being grouped together.

A vector 810 of block identifiers is generated based on the second column 806 of compressed data, as indicated by the arrows 808. The vector 810 includes a block identifier for each value identifier of the second column 806 of compressed data. The vector 810 may be generated by assigning a unique block identifier for each unique value identifier, and assigning a same block identifier for same value identifiers, where the block identifiers and value identifiers are at least unique within the scope of a block of data (which, in this example, is a block of value identifiers). Each block identifier may be an integer having a minimal binary coding based on an amount of block identifiers for a block. The vector 810 may be a collection of vectors for each block, where a series of block identifiers for a block forms a vector for that block.

For example, in FIG. 8 there is a block size of three rows (in practice, a block size might be hundreds or thousands of rows for a certain category of data tables; a size of a block may be tested for efficacy or chosen arbitrarily). For a first block 828 of value identifiers, all value identifiers are the same (i.e., "0000"), such that a same block identifier ('0,' in this case) is included in the vector 810. For a second block 830, there are two unique value identifiers ("0001" and "0002") such that two unique block identifiers are used for that block ('0' and '1') to represent those values in the vector 810, where the sequence of value identifiers 0001, 0001, 0002 is represented as the sequence of block identifiers 0, 0, 1. For a third block 832, the sequence of value identifiers 0002, 0003, 004 are represented as the sequence of block identifiers 00, 01, and 10 in the vector 810, as each of the value identifiers is unique in the scope of the block. In contrast to the second block 830, for the third block 832 two bits are used to code the block identifiers in the vector 810, as the block identifiers are represented using a minimal amount of bits for each block of block identifiers.

Although the vector 810 includes entries for a block vector having a same repeated value, a block vector of the vector 810 may contain nothing at all, by convention, to give a total size of 0 kilobits. Were the vector to have a block size of 1,024 rows, for a 1024-row block containing two different values, a block identifier vector may contain a series of 1,024 bits, each 0 or 1, to give a total size of 1 kilobits. For a 1,024-row block containing 1,024 different values, the block identifier vector may contains a series of 10-bit integers, to give a total size of 10 kilobits.

The columns 814 of block dictionaries include a column 816 of block identifiers and a column 818 of value identifiers. In the columns 814, each block is represented by a block dictionary, where a block dictionary consists of a combination of block identifiers and associated value identifiers.

The column 816 of block identifiers is generated based on the vector 810 of block identifiers as indicated by the arrows 812. In contrast to the vector 810 of block identifiers, the column 816 of block identifiers includes a minimal amount of block identifiers for a block. The amount is minimal in the sense that for a scope of a block, each utilized block identifier appears only once in the listing in column 816 for that block. Moreover, the block identifiers for a block that are listed in column 816 are listed in a canonical ordering, such as a numerical ordering. For example, the first block 828 of value identifiers that was represented in the vector 810 as the sequence 0, 0, 0 is represented as a single block identifier '0' in the column 816 of block identifiers. As another example, the third block 832 of value identifiers that is represented as the sequence 00, 01, and 10 in the vector 810 is represented as the block identifiers 00, 01, and 01 as each block identifier is unique in that block.

The column 820 of offset values corresponds to the block dictionaries of the columns 814 of the block dictionaries. The column 820 of offset values includes an offset value for each block, and each offset value indicates where, in the columns 814 of block dictionaries a dictionary for a block of data starts. For example, a first offset value 834 indicates that block identifiers for the first block of compressed data starts at a zero offset. As another example, a third offset value 836 indicates that block identifiers for the third block of compressed data starts at an offset of three (i.e., three rows from the top of the column 816 of block identifiers). The column 822 of block identifiers is the same as column 810 and is repeated to illustrate the correspondence between the offset values of the column 820 of offset values and block identifiers of the column 822 for each block, and how block identifiers of the block vectors in the column 822 of block vectors may be associated with the offset values of the column 820 of offset values. The offset values may greatly facilitate fast value lookup and may be mandatory if block dictionaries are reused. For example, for a block size of one K or 1,024, scrolling down column 820 of offset values may enable blocks to be located a thousand times faster. In addition, offset values may be a practical way to enable reuse of a block dictionary.

To save space, such as volatile memory space of a server, only the columns 814 of dictionaries of block identifiers, the column of offset values, and the vector 810 of block identifiers need be saved in lieu of a column of value identifiers, such as the column 802 of value identifiers.

The compression discussed with reference to FIG. 8 or similar techniques may be implemented at one or more servers, such as the hosts 504 of FIG. 5. The technique may run in parallel on different columns of data (e.g., with a column at each of the hosts 504).

The compression is advantageous as, for example, if a block contains a single value repeated 1,024 times where a block size is 1,024, and the single value is listed in a block dictionary for that block, then zero bits may be required to code the fact that the value is repeated (e.g., as only a block identifier '0' and an associated value identifier may represent the 1,024 instances of the value in the block and no block vector may exist, by convention). As another example, if a block contains two values (e.g., two values unique within the scope of the block) and these two values are listed in a block dictionary for that block, then one bit is required to specify for each row in the block vector in which the value occurs (e.g., 0 or 1 for a list of entries in a block vector). As another example, if a block contains three or four different values, again listed in a block dictionary, then two bits are required to specify for each row in the block vector in which the value occurs (e.g., 00, 01, 10, or 01). Thus, in general, if a block contains N different values such that the smallest integral power of two which is greater than or equal to N is 2 to the power of P, then P bits are required to specify for each row in the block vector which value in the block dictionary it takes. In a worst case scenario, if a block contains 1,024 different values, then 10 bits are required to specify for each row which value it takes (since 1,024 is equal to two to the tenth power).

As another example of a block dictionary for block vector compression, assuming a column (e.g., the column 806 of value identifiers) has a cardinality of C, where C is the number of different values in the entire column, and many of these values may repeat many times such that block vector compression may be applicable. If C is between 524,288 (i.e., 2^19) and 1,048,576 (i.e., 2^20) the value identifiers for a column may require 20 bits.

For a 1,024-row block containing a single repeated value, the block dictionary may contain a single entry specified by 20 bits. For a 1,024-row block containing two different values, the block dictionary may contain two block identifier bits and two 20-bit value identifier bits, to give a total of 42 bits (i.e., 20 bits for each value identifier and 1 bit for each block identifier). For a 1,024-row block containing 1,024 different values, the block dictionary may contain 1,024 block identifiers, each with 10 bits, and 1,024 value identifiers, each with 20 bits, to give a total of 30 kilobits (i.e., 30 bits times 1,024 entries).

In each case, a few more bits may be required to code an offset, where a number of bits depends on a length of an entire block dictionary. Adding block vector bit totals with the block dictionary bit totals for the above cases gives, respectively, 20 bits, 43 bits, and 40 kilobits for the three example cases considered. A worst-case scenario total using dictionary-based compression and bit vector compression together may be twice a total space required using only dictionary based compression for a column, which indicates that the bit vector compression may only be advantageously applicable for columns where a great majority of blocks include many repeated values.

To find a user-readable value associated with a given block identifier, there may be two dictionary lookups, although both lookups may rarely be required to be performed. For example, in response to a query for all records having a given value, first a dictionary for a column may be used to look up a value identifier associated with a value (such as a key figure or attribute), and then a block dictionary may be used to look up a block identifier associated with the value identifier in a given block. As another example, from a block identifier to a value, a block dictionary 814 may be used to look up a value identifier corresponding to a block identifier and then the dictionary for column 802 may be used to look up the value correspoding to the value identifier. To look up values in multiple blocks, multiple block dictionaries may be used to find associated block identifiers for a respective block.

Although FIG. 8 includes a certain combination of features as part of the compression, there may be variations. For example, block identifiers may be unique to a block of data.

As another example, block identifiers need not be compressed to a minimal amount of bits to represent a block of block identifiers. As another example, block identifiers need not start at '0' or be in an incremental ordering. As another example, although the word "each" is used in the description of compression of FIG. 8, the compression need not be so absolutely applied. For example, each block need not be compressed and an offset value need not exist for each block.

As another example, block dictionaries may be reused across several blocks. For example, value identifiers of a block may be either the same as for another block, such as a previous block, or very similar. In such cases, a previous dictionary may be reused as many times as possible.

For example, if values in a new block (i.e., a succeeding block) are either the same as in a previous block or form a subset of them, a previous block dictionary may be used as-is, and the only coding required for the new block may be to set its offset to be the same as for the previous block (as the same block dictionary is reused).

The following three conditions may be required before reuse of a dictionary for a succeeding block having additional block identifiers in comparison to a previous block: a succeeding block includes one or more values additional to those appearing in a previous block, which may be referred to as N additional values; a previous block includes M different values that can be coded using P bits; and a total M+N is still less than or equal to 2^P, such that the additional block identifier—value identifier pairs may be appended to a previous dictionary.

The new values may be appended to a previous dictionary and the offset for a new block may be set to be the same as for the previous block. In this manner, the new entries to the previous dictionary need not disturb applicability of the dictionary for the previous block (as the block identifier—value identifier pairs for the previous block do not change). If many blocks in a column are similar to previous blocks, reuse of a block dictionary may decrease space required to store a column by a large factor.

FIG. 9 is a block diagram of a table 900 illustrating a sorting of data across multiple columns 902. Sorted data in the columns 902 may be used for block vector compression, which is discussed with reference to FIGS. 8 and 10. Columns of the table 900 may be spread across multiple servers, such as the hosts 504 of FIG. 5. In general, the table 900 includes columns 902 of rows 904 of data, where one or more rows of data may represent structured data having data dependencies across the columns 902. For example, business objects may be modeled as sets of joined tables. As the data in the table 900 has data dependencies across the columns 902, sorting of a column may take into account these dependencies and may affect a resulted sorting.

The sorted data in the table 900 may represent a precondition for block vector compression as the data may be sorted to group as many repeated values together as possible. A difficulty may be that sorting the table 900 to optimize an ordering of the columns 902 sorts the entire rows, so other columns may become more disordered as a result. The sorting of the data in the table 900 may represent a sorting where the rows 904 are sorted sufficiently well to generate a good ordering of all the relevant table columns 902. Given various practical constraints, it may be unnecessary to optimize the technique (e.g., optimize in a mathematical sense to maximize a number of ordered blocks), and a robust heuristic that runs fast may be good enough for envisaged applications.

The sorting of the data in the table 900 may be one of many techniques for sorting data prior to block vector compression. Shaded sections of the table may indicate where there is no sorting in addition to sorting resulting from sorting of other sections (e.g., other columns of a same set of rows). The data in the table 900 may be value identifiers that are a result of dictionary-based compression.

The columns 908 include labels for rows 904 of the data, including block labels and row labels. For example, the first row 906 is in a block B1 and is row 1.

The data in the table 900 is the result of sorting columns 902 from a first column, to a second column, and so on down the sequence of columns 902. The columns 902 are not ordered but may be in some implementations. For example, columns that are expected to or known to have fewer unique values may be ordered earlier in a sequence of columns that are sorted, as a column having fewer unique values may be expected to have larger groupings of values such that block vector compression may be more efficient than it would be for columns later in the sequence. Also, block vector compression need not be performed on all columns and may only be applied on select columns, such as columns columns that meet some specified threshold criterion for benefiting sufficiently from block vector compression. For example, a comparison of space requirements for a column with or without block vector compression may be made and an impact of coding and runtime overheads of block vector compression may be made. Metrics related to space efficiency and overhead may be compared to determine whether to utilize block vector compression on one or more columns in a particular implementation.

The data in the table 900 is a result of sorting of columns as follows. In the example, the table 900 has five columns A1 to A5 and 35 rows divided into seven blocks B1 to B7, each having five rows, where each column entry has four possible values, coded with value identifiers zero to three. The columns are sorted from the first column A1 to the fifth column A5, with a result of sorting of a previous column affecting sorting of a succeeding column. In particular, column A1 is sorted such that value identifiers are ascending. Any blocks with uniform value identifiers in the column A1 are available for further sorting for the second column A2. In the table 900, these are blocks B1, B2, B4, and B7. For example, block B1 has all entries of '0' in column A1. Column A2 blocks B1, B2, B4, B7 are each sorted internally such that value identifiers are ascending. Any blocks with uniform A2 value identifiers are available for further sorting; these are blocks B1 and B6. Column A3 blocks B1 and B6 are each sorted internally such that value identifiers are ascending. Any blocks with uniform A3 value identifiers are available for further sorting; this includes block B1. Column A4 block B1 is sorted internally such that value identifiers ascending. Block B1 does not contain uniform A4 value identifiers so there is no further sorting (i.e., no sorting of value identifiers in A5).

Thus, in general, sorting includes sorting a first column such that like value identifiers are grouped together, such as sorting in ascending or descending order. For succeeding columns, only blocks having a same value identifier in a previous column are sorted, and those blocks are sorted such that there is a grouping of value identifiers. The sorting may continue until no blocks of a previous column have a same value identifier.

In some implementations, sorting may have an undesired effect of hindering table updates, which may require efficient random access to table rows. Updates may be collected and handled by separate delta indexes (as described above), which may be periodically merged with the main table indexes (i.e., asynchronously). The merge process may involve rebuilding table indexes, so a sort order as described above need not hinder table updates. In particular, it need not be a hindrance in the case that a compression technique involving re-sorting columns is implemented together with a buffering scheme for handling updates like the delta index approach described above.

Figure 10:
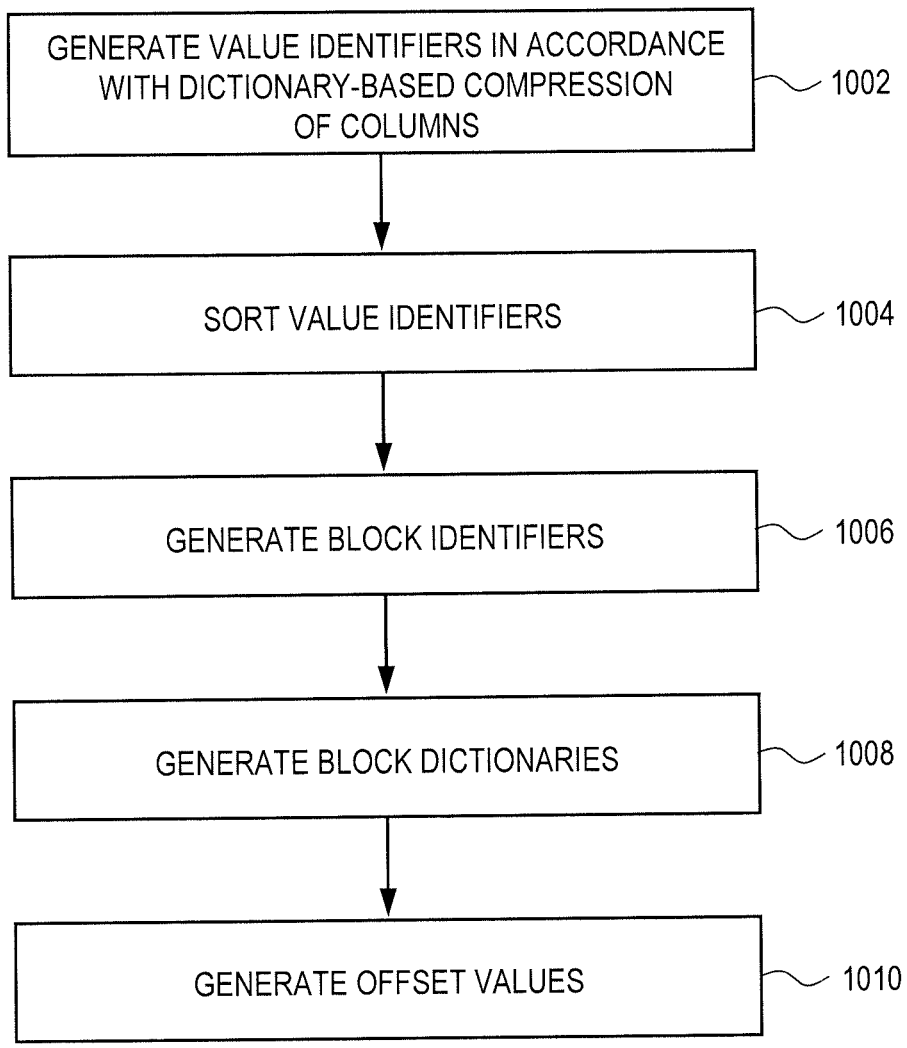
FIG. 10 is a flowchart of a process of compressing data.

FIG. 10 is a flowchart of a process 1000 of compressing data. The process 1000 may be implemented by the hosts 504 of FIG. 5. For example each of the hosts 504 may perform the process 1000 on a portion of data for which a host is responsible. The data that is compressed may be structured business data. The data may be compressed and searched in memory, as significant compression of the data may allow for cost-effective in-memory processing of the data (e.g., a number of servers or an amount of physical memory may be reduced).

In general, the process 1000 may be referred to as block vector compression, which may refer to blockwise compression of the data into vectors. The process 1000, involves compressing one or more columns of data in accordance with dictionary-based compression to generate columns of value identifiers (1002), sorting the value identifiers (1004), generating block identifiers (1006), generating block dictionaries (1008), and generating offset values (1010).

One or more columns of data are compressed in accordance with dictionary-based compression to generate columns of value identifiers (1002). The dictionary-based compression may use a minimal amount of bits to represent value identifiers based on a cardinality of values in a column.

The value identifiers are sorted (1004). Sorting of the value identifiers may include sorting multiple columns of value identifiers and may further involve sorting columns of value identifiers based on sorted value identifiers of other columns, as, for example, described with reference to FIG. 9.

Block identifiers are generated (1006). The block identifiers may be generated for each block of value identifiers in a selected column. For example, a determination may be made to apply block vector compression to a column and for each block of the column block identifiers may be generated where, for each block, a unique block identifier is generated for each unique value identifier in a block, and like block identifiers are used for like value identifiers.

Block dictionaries are generated (1008). A block dictionary may be generated for each block, and for each block dictionary block identifiers may be associated with a value identifier where block identifiers may only be included for each unique block identifier within the scope of a block. For example, with reference to FIG. 8, a block dictionary for the first block 828 has one, unique block identifier '0' (838).

Multiple block dictionaries may be included in columns of block dictionaries. For example, with reference to FIG. 8, multiple block dictionaries are included in the columns 814 of block dictionaries.

Block dictionaries may be reused. For example a block dictionary for one block may be reused for succeeding blocks that have the same block identifiers or have additional block identifiers (as described above).

Offset values are generated (1010). The offset values may indicate where a block starts in columns of block dictionaries, and the offset values may be associated with block identifiers in a block vector. The offset values may be included in a block offset column that is associated with a vector of block vectors (e.g., as shown by the column of offset values 820 having offset values associated with the column 822 of block vectors).

Although FIG. 10 includes a certain combination and type of sub-processes, the process 1000, block vector compression, or both may involve fewer, different, or additional sub-processes. As examples, not all columns need be sorted; not all columns need be compressed according to block vector compression; dictionary-based compression of the columns need not be performed for all or any columns; sorting of columns need not be dependent on results of sorting other columns; block dictionaries may be reused; additional sub-processes may include receiving a query of one or more columns of data and the block vectors may be used in concert with the block dictionaries to find data matching criteria of the query; a delta buffer may be used and the delta buffer may be searched, in parallel, with the block vector and results from the delta buffer may be merged with other results; block vectors, block dictionaries, and offset values may be stored; offset values might not be generated; and the like.

Although each of the figures describes a certain combination of features, implementations may vary. For example, additional, different, or fewer components may be included in the system 500 of FIG. 5.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, i.e., one or more computer programs tangibly embodied in an information carrier, e.g., in a machine-readable storage device or in a propagated signal, for execution by, or to control the operation of, data processing apparatus, e.g., a programmable processor, a computer, or multiple computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Media suitable for embodying computer program instructions and data include all forms of volatile (e.g., random access memory) or non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other in a logical sense and typically interact through a communication network. The relationship of client and server arises by virtue of computer programs running on the respective computers and having a client-server relationship to each other.

The subject matter described herein has been described in terms of particular embodiments, but other embodiments can be implemented and are within the scope of the following claims. For example, operations can differ and still achieve desirable results. In certain implementations, multitasking and parallel processing may be preferable. Other embodiments are within the scope of the following claims

What is claimed is:

1. A computer program product, embodied in a non-transitory computer-readable storage medium, the computer program product being operable to cause at least one data processing apparatus to perform operations comprising:
    performing, in parallel, block compression for each of a plurality of columns of data;
    storing, for each column of data, changes to the column of data after the block compression is performed in a different one of a plurality of delta buffers, wherein the delta buffers are separate from the corresponding columns of data; and
    asynchronously integrating, for each column of data, changes stored in the corresponding delta buffer into the corresponding column of data,
    wherein the columns of data and the delta buffers are searchable prior to the integration, and
    wherein search results from the columns of data and the delta buffers are merged to form a composite result.

2. A computer program product as in claim 1, wherein performing block compression comprises, for each column:
    compressing the column of data with dictionary-based compression, the compressing comprising generating a column of value identifiers, each of the value identifiers representing a unique value in the column of data;
    sorting values represented in the one or more columns of data, the sorting including ordering the one or more columns of data such that the one or more columns of data are ordered in order of frequency of most frequently occurring value in different columns of the one or more columns of data;
    generating a bit vector representation of each column representing whether a value in rows of each column occurs frequently;
    generating a number representing frequency of the most frequently occurring value for each column;
    removing bits corresponding to the most frequently occurring value from the bit vector to obtain a shortened bit vector, the shortened bit vector obtained for each column; and
    storing the generated number and the shortened bit vector for each column, the stored number and the shortened bit vector for each column representing the compressed data, the compressed data being decompressed when a search is performed, the decompressed data being compressed again after the search is performed.

3. A computer program product as in claim 1, wherein the compressing is initiated when a column of data comprises one value that has a repetition frequency significantly higher than a repetition frequency of other values in the column.

4. A computer program product as in claim 1, wherein the value identifiers are values representing structured business data having data dependencies across a same row of a table.

5. A computer program product as in claim 4, wherein the business data comprises business objects modeled as sets of joined tables.

6. A computer program product as in claim 5, wherein the operations of the product are performed in parallel on a plurality of hardware servers.

7. A computer program product as in claim 1, wherein the search comprises searching for data in the one or more columns of data.

8. A computer-implemented method comprising:
    performing, in parallel, block compression for each of a plurality of columns of data;
    storing, for each column, changes to the column of data after the block compression is performed in a different one of a plurality of delta buffers, wherein the delta buffers are separate from the corresponding columns of data; and
    asynchronously integrating, for each column, changes stored in the delta buffer into the column of data, wherein, for each column, both of the column of data and the delta buffer are searchable prior to the integration, wherein search results from the columns of data and the delta buffers are merged to form a composite result.

9. A method as in claim 8, wherein performing block compression comprises, for each column:

compressing the column of data with dictionary-based compression, the compressing comprising generating a column of value identifiers, each of the value identifiers representing a unique value in the column of data;

sorting values represented in the one or more columns of data, the sorting including ordering the one or more columns of data such that the one or more columns of data are ordered in order of frequency of most frequently occurring value in different columns of the one or more columns of data;

generating a bit vector representation of each column representing whether a value in rows of each column occurs frequently;

generating a number representing frequency of the most frequently occurring value for each column;

removing bits corresponding to the most frequently occurring value from the bit vector to obtain a shortened bit vector, the shortened bit vector obtained for each column; and storing the generated number and the shortened bit vector for each column, the stored number and the shortened bit vector for each column representing the compressed data, the compressed data being decompressed when a search is performed, the decompressed data being compressed again after the search is performed.

10. A method as in claim 8, wherein the compressing is initiated when a column of data comprises one value that has a repetition frequency significantly higher than a repetition frequency of other values in the column.

11. A method as in claim 8, wherein the value identifiers are values representing structured business data having data dependencies across a same row of a table.

12. A method as in claim 8, wherein the business data comprises business objects modeled as sets of joined tables.

13. A method as in claim 12, wherein the operations of the product are performed in parallel on a plurality of hardware servers.

14. A method as in claim 8, wherein the search comprises searching for data in the one or more columns of data.

15. A method as in claim 8, wherein the performing, storing, and integrating are performed by at least one data processor forming part of at least one computing system.

16. A system comprising:
at least one programmable processor; and
memory storing instructions that, when executed by the at least one programmable processor, cause the at least one programmable processor to perform operations comprising:
performing, in parallel, block compression for each of a plurality of columns of data, the block compression comprising generating, for each column, a block offset column such that each value of the block offset column indicates an offset at which a block starts in the one or more columns of data;

storing, for each column, changes to the column of data after the block compression is performed in a different one of a plurality of delta buffers, wherein the delta buffers are separate from the columns of data;

asynchronously integrating, for each column, changes stored in the corresponding delta buffer into the corresponding column of data;

receiving a query; and searching both the compressed column of data and the delta buffer for data responsive to the query.

17. A system as in claim 16, wherein performing block compression comprises, for each column:

compressing the column of data with dictionary-based compression, the compressing comprising generating a column of value identifiers, each of the value identifiers representing a unique value in the column of data;

sorting values represented in the one or more columns of data, the sorting including ordering the one or more columns of data such that the one or more columns of data are ordered in order of frequency of most frequently occurring value in different columns of the one or more columns of data;

generating a bit vector representation of each column representing whether a value in rows of each column occurs frequently;

generating a number representing frequency of the most frequently occurring value for each column;

removing bits corresponding to the most frequently occurring value from the bit vector to obtain a shortened bit vector, the shortened bit vector obtained for each column; and storing the generated number and the shortened bit vector for each column, the stored number and the shortened bit vector for each column representing the compressed data, the compressed data being decompressed when a search is performed, the decompressed data being compressed again after the search is performed.

18. A system as in claim 16, wherein the compressing is initiated when a column of data comprises one value that has a repetition frequency significantly higher than a repetition frequency of other values in the column.

19. A system as in claim 16, wherein the value identifiers are values representing structured business data having data dependencies across a same row of a table.

20. A system as in claim 19, wherein:
the business data comprises business objects modeled as sets of joined tables;
the operations of the product are performed in parallel on a plurality of hardware servers; and
the search comprises searching for data in the one or more columns of data.

* * * * *